US012672275B2

(12) United States Patent
Park et al.

(10) Patent No.: US 12,672,275 B2
(45) Date of Patent: Jun. 30, 2026

(54) SEMICONDUCTOR DEVICES

(71) Applicant: Samsung Electronics Co., Ltd.,
Suwon-si (KR)

(72) Inventors: Jaehyung Park, Suwon-si (KR); Hoju Song, Suwon-si (KR); Eunjung Kim, Suwon-si (KR); Kihyung Nam, Suwon-si (KR); Yunjae Lee, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 534 days.

(21) Appl. No.: 18/140,004

(22) Filed: Apr. 27, 2023

(65) Prior Publication Data

US 2024/0081045 A1 Mar. 7, 2024

(30) Foreign Application Priority Data

Jul. 6, 2022 (KR) ......................... 10-2022-0082966

(51) Int. Cl.
H10B 12/00 (2023.01)

(52) U.S. Cl.
CPC ......... H10B 12/482 (2023.02); H10B 12/315 (2023.02)

(58) Field of Classification Search
CPC ............................ H10B 12/315; H10B 12/482
See application file for complete search history.

(56) References Cited

U.S. PATENT DOCUMENTS

| | | | |
|---|---|---|---|
| 4,763,180 A | 8/1988 | Hwang et al. | |
| 5,780,335 A | 7/1998 | Henkels et al. | |
| 6,617,180 B1 | 9/2003 | Wang | |
| 7,049,654 B2 | 5/2006 | Chang | |
| 7,332,779 B2 | 2/2008 | Chang | |
| 7,522,464 B2 | 4/2009 | Yoo et al. | |
| RE44,688 E | 12/2013 | Kelly et al. | |
| 9,484,355 B2 | 11/2016 | Jung et al. | |
| 9,508,723 B2 * | 11/2016 | Lee ..................... | H10D 64/017 |

(Continued)

FOREIGN PATENT DOCUMENTS

| | | |
|---|---|---|
| CN | 1938836 A | 3/2007 |
| CN | 108962894 A | 12/2018 |

(Continued)

*Primary Examiner* — Steven M Page
(74) *Attorney, Agent, or Firm* — Wolf, Greenfield & Sacks, P.C.

(57) ABSTRACT

A semiconductor device includes a substrate including a first region and a second region, a bit line structure that extends over the first region and the second region, an upper spacer structure on a first sidewall of the bit line structure on the first region of the substrate, and an insulation spacer structure on the first sidewall of the bit line structure on the second region of the bit line structure. The upper spacer structure may include first, second and third upper spacers sequentially stacked on the sidewall of the bit line structure in a first horizontal direction. The insulation spacer structure may include first, second, third and fourth insulation spacers sequentially stacked on the sidewall of the bit line structure in the first horizontal direction. The first, second and third insulation spacers include substantially the same materials as the first, second and third upper spacers, respectively.

18 Claims, 40 Drawing Sheets

(56)  References Cited

U.S. PATENT DOCUMENTS

|  |  |  |  |
|---|---|---|---|
| 9,806,081 | B2 | 10/2017 | Yim |
| 10,217,747 | B2 | 2/2019 | Kim |
| 10,714,686 | B2 | 7/2020 | Kim et al. |
| 11,121,135 | B1 | 9/2021 | Ikeda |
| 11,271,073 | B2 | 3/2022 | Kim |
| 2006/0054958 | A1 | 3/2006 | Weis et al. |
| 2008/0121961 | A1 | 5/2008 | Schloesser |
| 2020/0266198 | A1 | 8/2020 | Ji et al. |
| 2020/0402981 | A1* | 12/2020 | Kim .................. H10B 12/0335 |
| 2021/0125998 | A1* | 4/2021 | Kim ...................... H10B 12/05 |
| 2021/0151447 | A1 | 5/2021 | Chuang et al. |
| 2021/0193664 | A1 | 6/2021 | Seong et al. |
| 2022/0020758 | A1 | 1/2022 | Park et al. |
| 2022/0139921 | A1 | 5/2022 | Kim et al. |
| 2022/0139927 | A1 | 5/2022 | Chang et al. |
| 2022/0173107 | A1 | 6/2022 | Moon et al. |

FOREIGN PATENT DOCUMENTS

|  |  |  |  |
|---|---|---|---|
| TW | 200618190 | A | 6/2006 |
| TW | 200814318 | A | 3/2008 |
| TW | 202145455 | A | 12/2021 |
| TW | 202220143 | A | 5/2022 |
| TW | 202220170 | A | 5/2022 |

* cited by examiner

F I G. 5
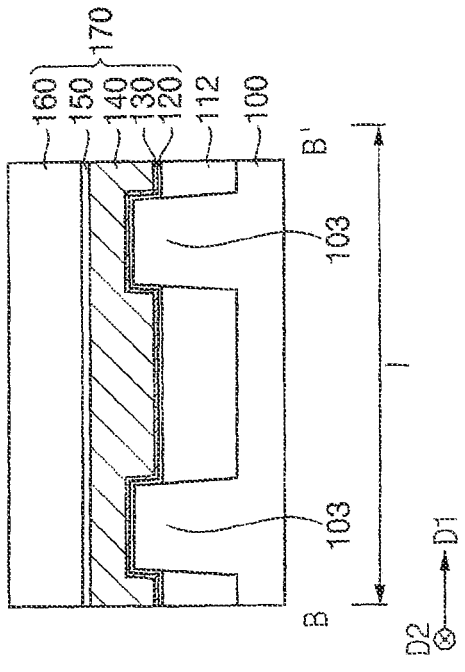
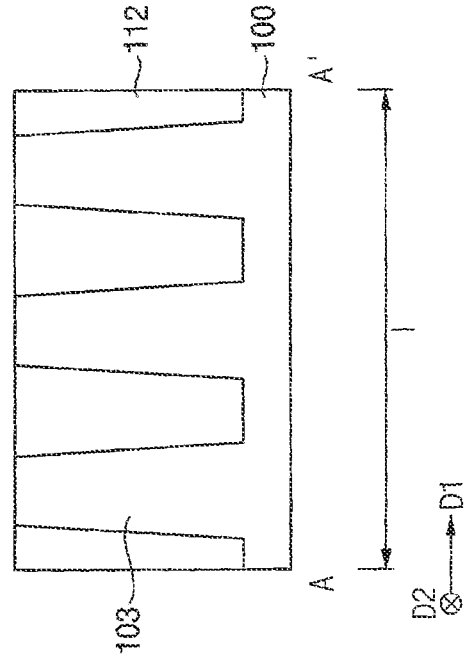

SEMICONDUCTOR DEVICES

CROSS-REFERENCE TO RELATED APPLICATION

This application claims priority under 35 U.S.C. § 119 to Korean Patent Application No. 10-2022-0082966 filed on Jul. 6, 2022, in the Korean Intellectual Property Office, and the entire contents of the above-identified application are incorporated by reference herein.

TECHNICAL FIELD

Example embodiments of the present disclosure relate to semiconductor devices. More particularly, example embodiments of the present disclosure relate to DRAM devices.

DISCUSSION OF RELATED ART

In DRAM devices, a spacer may be formed on a sidewall of a bit line, and the spacer may be formed by forming a spacer layer on an upper surface and a sidewall of the bit line and partially etching the spacer layer. During partially etching the spacer layer, a portion of the bit line may also be removed due to over-etching.

SUMMARY

Example embodiments provide semiconductor devices having improved characteristics.

According to some example embodiments of the inventive concepts, there is a semiconductor device. The semiconductor device may include a substrate including a first region and a second region, a bit line structure that extends over the first region and the second region of the substrate, an upper spacer structure on a first sidewall of the bit line structure on the first region of the substrate, and an insulation spacer structure on the first sidewall of the bit line structure on the second region of the bit line structure. The upper spacer structure may include first, second and third upper spacers that are sequentially stacked on the sidewall of the bit line structure in a first horizontal direction. The insulation spacer structure may include first, second, third and fourth insulation spacers that are sequentially stacked on the first sidewall of the bit line structure in the first horizontal direction. The first, second and third insulation spacers may include substantially the same materials as the first, second and third upper spacers, respectively.

According to some example embodiments of the inventive concepts, there is a semiconductor device. The semiconductor device may include a substrate including a cell region and an extension region at a side of the cell region, an isolation pattern on the substrate, an active pattern on the substrate defined by the isolation pattern, a bit line structure having a first portion extending on the cell region of the substrate and a second portion extending on the extension region of the substrate, an upper spacer structure on a sidewall of the first portion of the bit line structure, and an insulation spacer structure on a sidewall of the second portion of the bit line structure. The first portion of the bit line structure may be on the active pattern and the isolation pattern on the cell region of the substrate, and the second portion of the bit line structure may be on the isolation pattern on the extension region of the substrate. A thickness of the insulation spacer structure in a first horizontal direction may be greater than a thickness of the upper spacer structure in the first horizontal direction.

According to some example embodiments of the inventive concepts, there is a semiconductor device. The semiconductor device may include a substrate including a first region and a second region, an isolation pattern on the substrate, an active pattern of which a sidewall is surrounded by the isolation pattern on the first region of the substrate, a bit line structure on the first and second regions of the substrate, an upper spacer structure on a sidewall of the bit line structure on the first region of the substrate, and an insulation spacer structure on the sidewall of the bit line structure on the second region of the bit line structure. The upper spacer structure may include first, second and third upper spacers sequentially stacked on the sidewall of the bit line structure in a first horizontal direction. The insulation spacer structure may include first, second, third and fourth insulation spacers sequentially stacked on the sidewall of the bit line structure in the first horizontal direction. The first, second and third insulation spacers may include substantially the same materials as the first, second and third upper spacers, respectively.

In the method of manufacturing the semiconductor device in accordance with some example embodiments, during the etching process for forming the spacer structure on the sidewall of the bit line structure, the conductive structure included in the end portion of the bit line structure may not be removed. Thus, the deterioration of the electric characteristics of the bit line structure may be prevented or lessened so that the electric characteristic of the semiconductor device may be enhanced.

BRIEF DESCRIPTION OF THE DRAWINGS

FIGS. 5, 6, 8, 9, 11, 12, 13, 14, 16, 17, 18, 19, 20, 21, 22, 23, 24, 25, 26, 27, 28, 29, 31, 32, 34, 35, 36, 38, and 39 are cross-sectional views illustrating portions of a method of manufacturing a semiconductor device in accordance with some example embodiments.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

Figure 1:
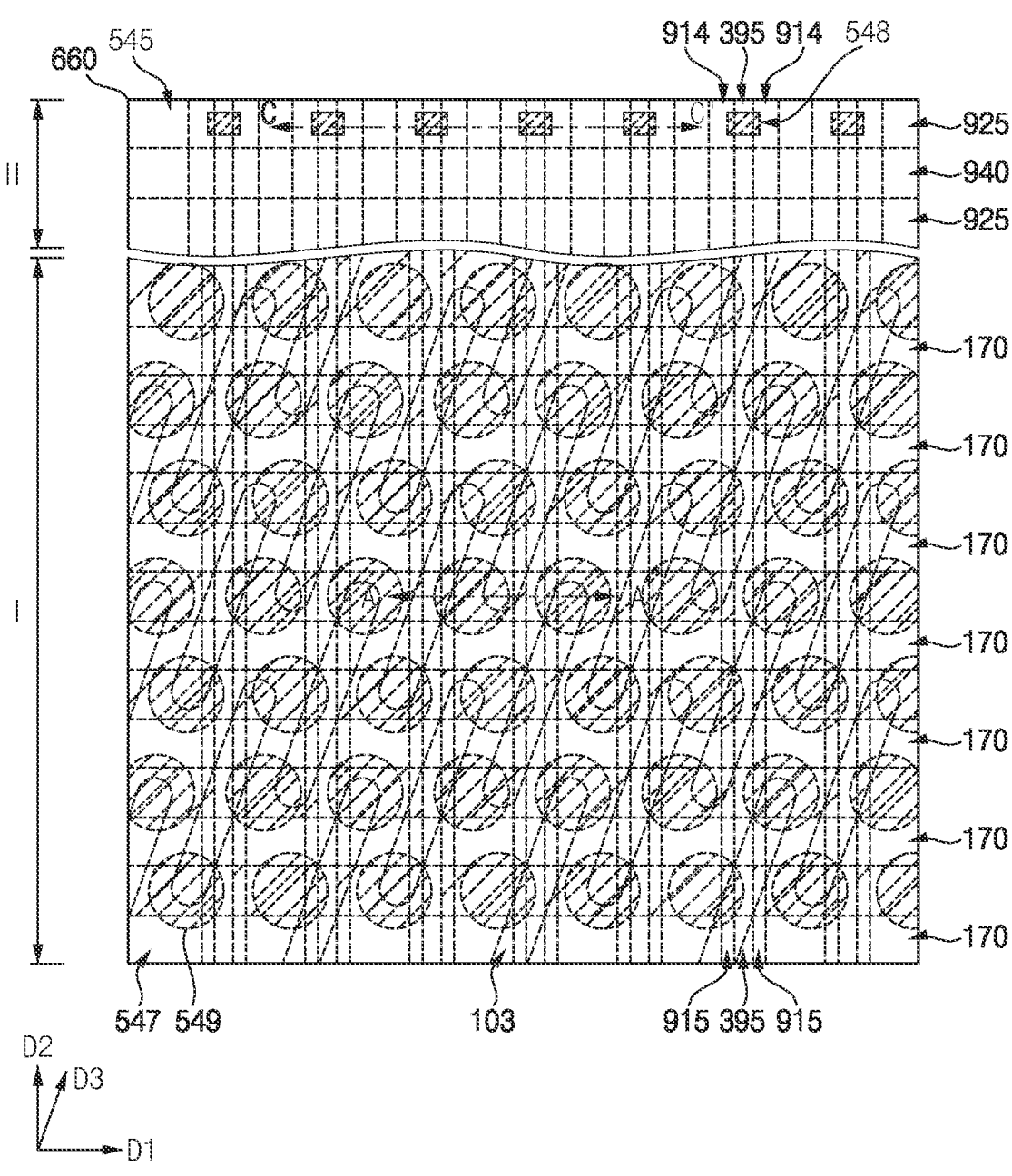
FIG. 1 is a plan view illustrating a semiconductor device in accordance with example embodiments.
Figure 2:
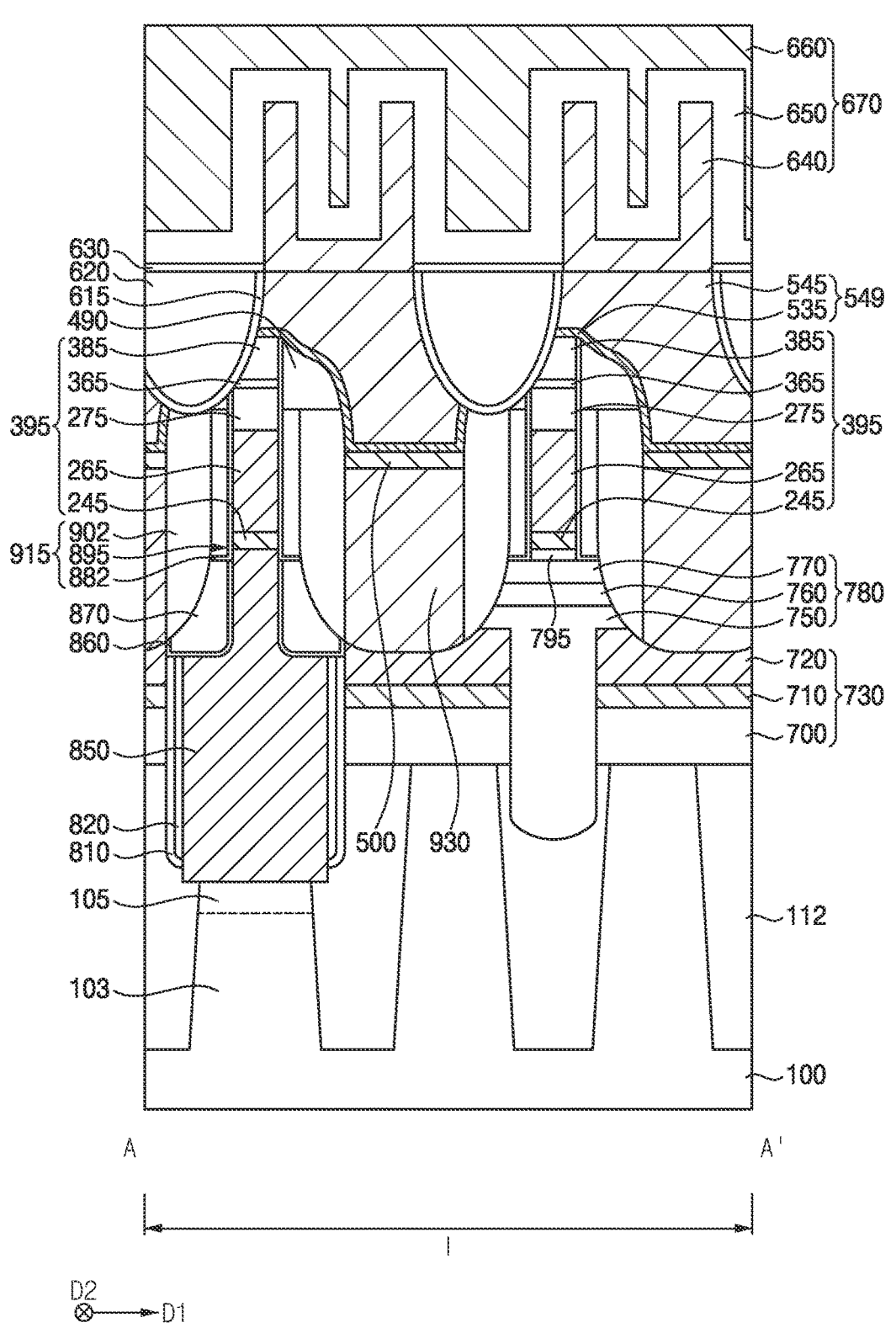
FIG. 2 is a cross-sectional view taken along line A-A' of FIG. 1, and FIGS. 3A and 3B are cross-sectional views taken along line C-C' of FIG. 1.
Figure 3A:
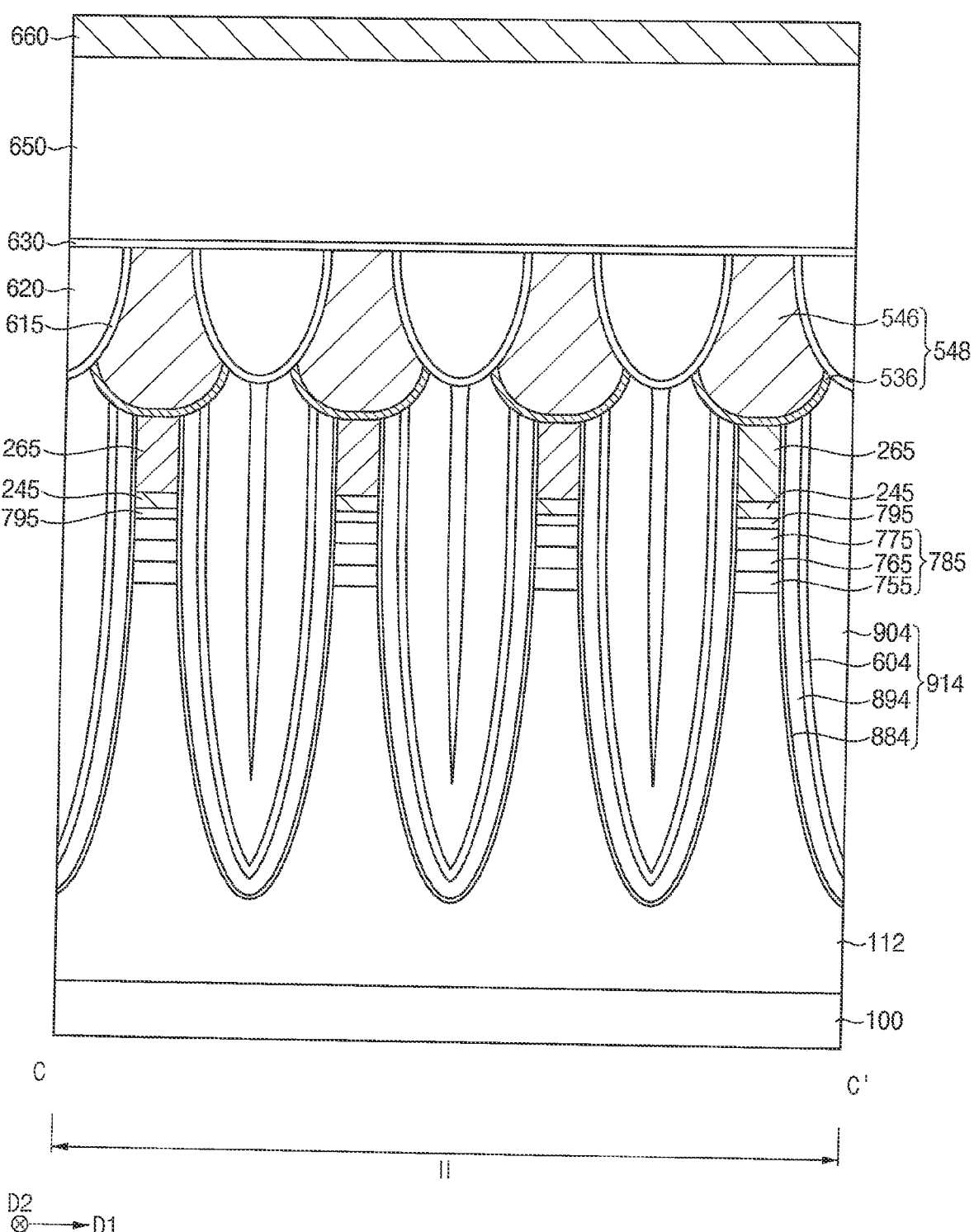
Figure 3B:
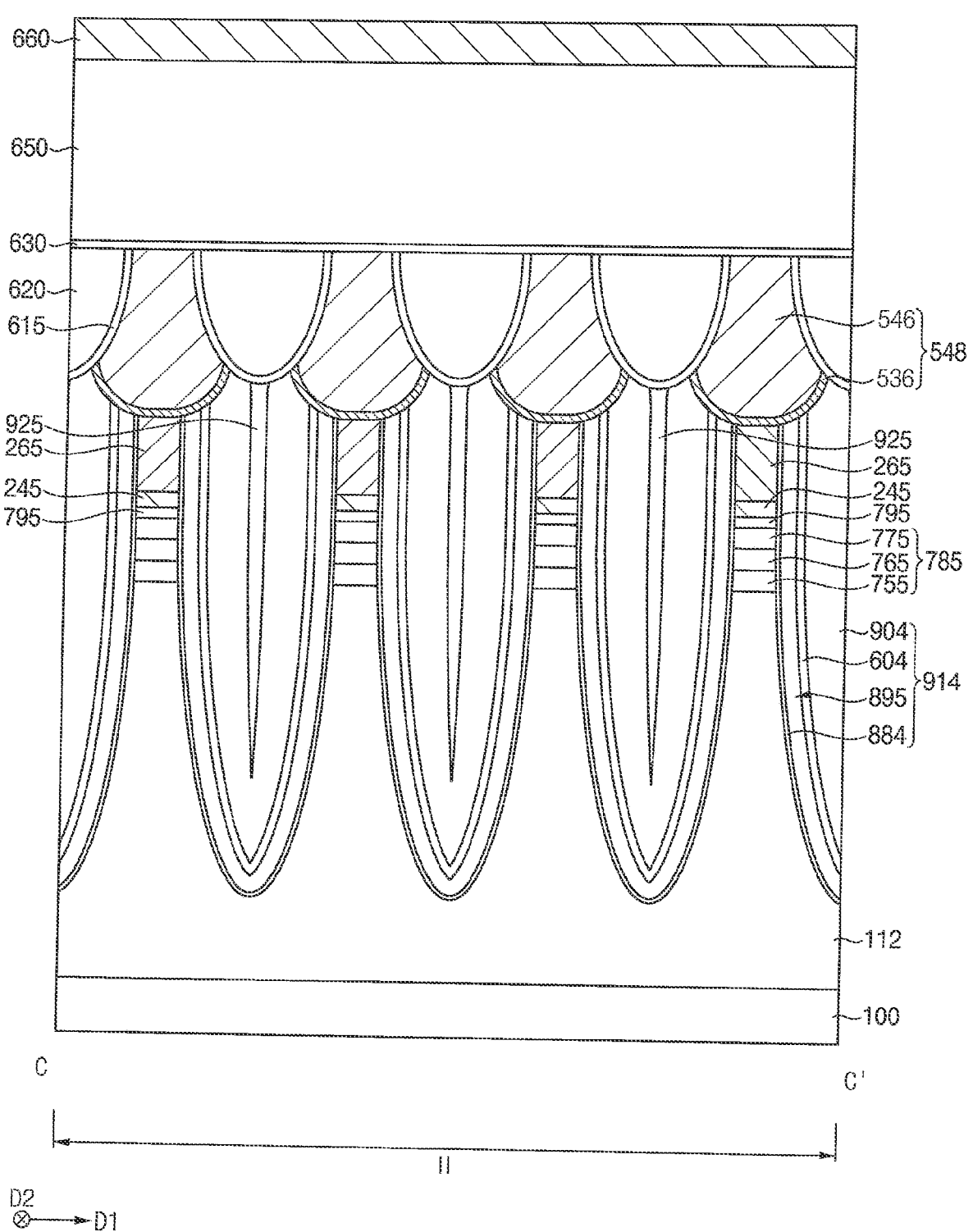

FIG. 1 is a plan view illustrating a semiconductor device in accordance with example embodiments, FIG. 2 is a cross-sectional view taken along line A-A' of FIG. 1, and FIGS. 3A and 3B are cross-sectional views taken along line C-C' of FIG. 1.

Hereinafter, in the specification (and not necessarily in the claims), two directions among horizontal directions substantially parallel to an upper surface of a substrate 100, which are substantially perpendicular to each other, may be referred to as first and second directions D1 and D2, respectively, and a direction among the horizontal directions that has an acute angle with respect to the first and second directions D1 and D2 may be referred to as a third direction D3. Additionally, a direction that is substantially perpendicular to the upper surface of the substrate 100 may be referred to as a vertical direction.

Referring to FIGS. 1, 2, 3A, and 3B, the semiconductor device may include an active pattern 103, an isolation pattern 112, a gate structure 170, a filling structure, a bit line structure 395, an upper spacer structure 915, a contact plug structure, an insulation spacer structure 914, a third contact plug 548 and a capacitor 670.

Additionally, the semiconductor device may include a conductive pad structure 730, an insulating pad layer structure 780, first and second insulation pattern structures, a first etch stop pattern 795, a fourth etch stop layer 630, a fourth upper spacer 490, a third capping pattern 940 and a first insulation pattern 925.

The substrate 100 may include silicon, germanium, silicon-germanium, or a III-V group compound semiconductor, such as GaP, GaAs, or GaSb. In some example embodiments, the substrate 100 may be a silicon-on-insulator (SOI) substrate or a germanium-on-insulator (GOI) substrate.

In some example embodiments, the substrate 100 may include first and second regions I and II. The first region I may be a cell region in which memory cells are formed, and the second region II may be an extension region in which an end portion of the bit line structure 395 in the first region I is formed.

In some example embodiments, the second region II may be formed at opposite sides of the first region I, and FIG. 1 shows the second region II at one side of the first region I.

In some embodiments, the substrate 100 may further include a third region (not shown) in addition to the first and second regions I and II, and peripheral circuit patterns for applying electrical signals to the memory cells may be formed on the third region of the substrate 100.

In some example embodiments, the active pattern 103 may extend in the third direction D3 on the first region I of the substrate 100, and a plurality of active patterns 103 may be spaced apart from each other in the first and second directions D1 and D2. The active pattern 103 may include substantially the same material as the substrate 100.

The isolation pattern 112 may be formed on the first region I of the substrate 100, and may cover a sidewall of the active pattern 103, or the sidewalls of each active pattern 103, and may also be formed on the second region II of the substrate 100. The isolation pattern 112 may include an oxide, e.g., silicon oxide.

Referring to FIGS. 1, 2, 3A and 3B together with FIG. 5 (a cross-sectional view described in greater detail below), the gate structure 170 may be formed in a second recess extending through upper portions of the active pattern 103 and the isolation pattern 112 in the first direction D1. The gate structure 170 may include a gate insulation pattern 120 on a bottom and a sidewall of the second recess, a first barrier pattern 130 on a portion of the gate insulation pattern 120 on the bottom and a lower sidewall of the second recess, a first conductive pattern 140 on the first barrier pattern 130 that is in a lower portion of the second recess, a second conductive pattern 150 on upper surfaces of the first barrier pattern 130 and the first conductive pattern 140, and a gate mask 160 on an upper surface of the second conductive pattern 150 and an upper inner sidewall of the gate insulation pattern 120 that is in an upper portion of the second recess. The first barrier pattern 130, the first conductive pattern 140 and the second conductive pattern 150 may form a gate electrode.

The gate insulation pattern 120 may include an oxide, e.g., silicon oxide. The first barrier pattern 130 may include a metal nitride, e.g., titanium nitride, tantalum nitride, etc. The first conductive pattern 140 may include, e.g., a metal, a metal nitride, a metal silicide, doped polysilicon, etc. The second conductive pattern 150 may include, e.g., doped polysilicon, and the gate mask 160 may include a nitride, e.g., silicon nitride.

In some example embodiments, the gate structure 170 may extend in the first direction D1 on the first region I of the substrate 100, and a plurality of gate structures 170 may be spaced apart from each other in the second direction D2.

Referring to FIGS. 1, 2, 3A, and 3B together with FIGS. 7 and 8 (which are views described in greater detail below), a plurality of conductive pad structures 730 may be spaced apart from each other in the first and second directions D1 and D2 on the first region I of the substrate 100, and may be arranged in a lattice pattern.

In some example embodiments, the conductive pad structure 730 may overlap in the vertical direction an end portion of the active pattern 103 that extends in the third direction D3 and a portion of the isolation pattern 112 adjacent thereto in the first direction D1.

In some example embodiments, the conductive pad structure 730 may include first, second and third conductive pads 700, 710 and 720 sequentially stacked in the vertical direction. In some example embodiments, the first conductive pad 700 may include, e.g., doped polysilicon. The second conductive pad 710 may include a metal silicide, e.g., titanium silicide, cobalt silicide, nickel silicide, etc., a metal nitride, e.g., titanium nitride, tantalum nitride, tungsten nitride, etc., and/or a metal silicon nitride, e.g., titanium silicon nitride, tantalum silicon nitride, etc. The third conductive pad 720 may include a metal, e.g., tungsten, ruthenium, etc. Thus, the conductive pad structure 730 may have a multi-layered structure.

Referring to FIGS. 1, 2, 3A, and 3B together with FIGS. 7, 8 and 15 (which are views described in greater detail below), the insulating pad layer structure 780 may include a first, second, and third insulation pad layers 750, 760 and 770 sequentially stacked in the vertical direction. The first insulation pad layer 750 may be formed in a second opening 740 that extends through the conductive pad structure 730 and exposes an upper surface of the active pattern 103 or an upper surface of the isolation pattern 112 on the first region I of the substrate 100, and the second and third insulation pad layers 760 and 770 may be sequentially stacked on the first insulation pad layer 750. The second opening 740 may include a first portion that extends in the first direction D1 and a second portion that extends in the second direction D2, and the first portion and second portion may be connected to each other. Thus, the first insulation pad layer 750 in the second opening 740 may surround the conductive pad structures 730 arranged in a lattice pattern in a plan view.

In some example embodiments, the first and third insulation pad layers 750 and 770 may include an insulating nitride, e.g., silicon nitride, and the second insulation pad layer 700 may include a metal oxide, e.g., hafnium oxide, zirconium oxide, etc.

Referring to FIGS. 1, 2, 3A, and 3B together with FIGS. 7, 8 and 11 (which are views described in greater detail below), a third opening 805 may extend through the conductive pad structure 730 and may expose upper surfaces of the active pattern 103, the isolation pattern 112 and the gate mask 160 may be formed on the first region I of the substrate 100, and an upper surface of a central portion of the active pattern 103 in the third direction D3 may be exposed by the third opening 805.

In some example embodiments, a bottom of the third opening 805 may be wider than the upper surface of the active pattern 103 exposed by the third opening 805, and thus an upper surface of the isolation pattern 112 adjacent to the active pattern 103 may also be exposed by the third opening 805.

An impurity region 105 including n-type or p-type impurities may be formed at an upper portion of the active pattern 103 exposed by the third opening 805, and the filling structure may be formed in the third opening 805 to contact an upper surface of the impurity region 105.

In some example embodiments, the filling structure may include a conductive filling pattern 850, a lower spacer structure, a second capping pattern 860 and an insulating filling pattern 870.

In some example embodiments, the conductive filling pattern 850 may include a lower portion having a relatively large width in a direction (e.g., the first direction D1) and an upper portion having a relatively small width in the same direction (e.g., the first direction D1). The conductive filling pattern 850 may include a metal, e.g., tungsten.

The lower spacer structure may cover a sidewall of the lower portion of the conductive filling pattern 850, and may include first and second spacers 810 and 820 stacked in the horizontal direction from a sidewall of the third opening 805. The first lower spacer 810 may include, e.g., silicon oxide, and the second spacer 820 may include, e.g., silicon oxycarbide.

Alternatively, the lower spacer structure may include the first lower spacer 810, the second lower spacer 820 and a third lower spacer, which may be sequentially stacked in the horizontal direction, which may include, e.g., silicon nitride, silicon oxide and silicon nitride, respectively.

In some example embodiments, an upper surface of the lower (wider) portion of the conductive filling pattern 850 may be substantially coplanar with an uppermost surface of the first and second lower spacers 810 and 820.

The second capping pattern 860 may cover a sidewall of the upper portion of the conductive filling pattern 850 and the upper surface of the lower portion of the conductive filling pattern 850, and the insulating filling pattern 870 may be formed on the second capping pattern 860. The second capping pattern 860 may include an oxide, e.g., silicon oxide or an insulating nitride, e.g., silicon nitride, and the insulating filling pattern 870 may include an insulating nitride, e.g., silicon nitride.

In some example embodiments, the bit line structure 395 may extend in the second direction D2 on the first and second regions I and II of the substrate 100, and a plurality of bit line structures 395 may be spaced apart from each other in the first direction D1.

In some example embodiments, the bit line structure 395 may be formed on the filling structure and the first etch stop pattern 795 on the first region I of the substrate 100, and may be formed on the first etch stop pattern 795 on the second region II of the substrate 100. The bit line structure 395 may overlap a central portion in the third direction D3 of each of the active patterns 103 in the vertical direction.

The first etch stop pattern 795 may be formed between the insulating pad layer structure 780 and the bit line structure 395 on the first region I of the substrate 100, and may be formed between the insulation pad structure 785 on the isolation pattern 112 and the bit line structure 395. The first etch stop pattern 795 may include, e.g., silicon nitride.

The insulation pad structure 785 may include first, second and third insulation pads 755, 765 and 775 sequentially stacked in the vertical direction, which may include substantially the same materials as those of the first, second and third insulation pad layers 750, 760 and 770, respectively, and may be formed at the same levels, respectively.

In some example embodiments, the bit line structure 395 may include an adhesion pattern 245, a third conductive pattern 265, a second mask 275, a third etch stop pattern 365 and a first capping pattern 385. The adhesion pattern 245, the third conductive pattern 265 and the first capping pattern 385 may collectively form an insulation structure. In some example embodiments, the second mask 275, the third etch stop pattern 365 and the first capping pattern 385 sequentially stacked may be merged with each other to form a single insulation structure.

The adhesion pattern 245 may include a metal nitride, e.g., titanium nitride, tantalum nitride, tungsten nitride, etc. The third conductive pattern 265 may include a metal, e.g., tungsten, titanium, tantalum, ruthenium, etc. Each of the second mask 275, the third etch stop pattern 365 and the first capping pattern 385 may include an insulating nitride, e.g., silicon nitride.

The upper spacer structure 915 may include a first upper spacer 882, an air spacer 895 and a third upper spacer 902 sequentially stacked in the horizontal direction on each of opposite sidewalls in the first direction D1 of the bit line structure 395 on the first region I of the substrate 100. The first upper spacer 882 may partially cover upper surfaces of the second capping pattern 860 and the insulating filling pattern 870 included in the filling structure, and the third upper spacer 902 may partially cover the upper surfaces of the second capping pattern 860 and the insulating filling pattern 870 included in the filling structure.

The first upper spacer 882 may include an insulating nitride, e.g., silicon nitride, the air spacer 895 may include air, and the third upper spacer 902 may include an insulating nitride, e.g., silicon nitride.

The fourth upper spacer 490 may be formed on an outer sidewall of a portion of the first upper spacer 882 on each of opposite sidewalls in the first direction D1 of an upper portion of the bit line structure 395, and may cover a top of the air spacer 895 and at least a portion of an upper surface of the third upper spacer 902. The fourth upper spacer 490 may include an insulating nitride, e.g., silicon nitride.

As best seen in FIGS. 3A and 3B, the insulation spacer structure 914 may include first, second, third and fourth insulation spacers 884, 894, 604 and 904 sequentially stacked in the horizontal direction on each of opposite sidewalls in the first direction D1 of the bit line structure 395 on the second region II of the substrate 100.

In some example embodiments, the insulation spacer structure 914 may contact sidewalls of adjacent bit line structures 395 facing each other in the first direction D1.

Additionally, the insulation spacer structure 914 may also cover at least portions (e.g., sidewalls) of the first etch stop pattern 795, the insulation pad structure 785 and an upper sidewall of the isolation pattern 112.

In some example embodiments, the first and fourth insulation spacers 884 and 904 may include substantially the same materials as the first and third upper spacers 882 and 902, respectively. In some example embodiments, the second insulation spacer 894 may include an oxide, e.g., silicon oxide, and is shown in FIG. 3A. Alternatively, in some embodiments, the insulation spacer structure 914 may include the air spacer 895 instead of the second insulation spacer 894, and is shown in FIG. 3B.

The fourth insulation spacer 904 may include an insulating nitride, e.g., silicon nitride. In some example embodiments, the fourth insulation spacer 904 may include substantially the same material as the third insulation spacer 604, and thus may be merged with the third insulation spacer 604 to form a spacer.

In some example embodiments, the first insulation spacer 884, the second insulation spacer 894 and the fourth insulation spacer 904 may include substantially the same materials as the first upper spacer 882, the air spacer 895 and the third upper spacer 902, respectively. The insulation spacer structure 914 may further include the third insulation spacer 604 when compared to the upper spacer structure 915, and thus may have a thickness in the horizontal direction greater than that of the upper spacer structure 915.

In some example embodiments, a plurality of third capping patterns 940 may be spaced apart from each other in the second direction D2 between ones of the bit line structures 395 neighboring in the first direction D1 in the first region I of the substrate 100, and the contact plug structure may be formed between ones of the third capping pattern 940 neighboring in the second direction D2.

The third capping pattern 940 may include an insulating nitride, e.g., silicon nitride.

The contact plug structure may include a first contact plug 930, an ohmic contact pattern 500 and a second contact plug 549 sequentially stacked in the vertical direction on the conductive pad structure 730.

The first contact plug 930 may contact the third conductive pad 720 to be electrically connected to the active pattern 103. The first contact plug 930 may include, e.g., doped polysilicon, and the ohmic contact pattern 500 may include a metal silicide, e.g., titanium silicide, cobalt silicide, nickel silicide, etc.

In some example embodiments, the second contact plug 549 may include a third metal pattern 545 and a second barrier pattern 535 covering a lower surface of the third metal pattern 545. The third metal pattern 545 may include a metal, e.g., tungsten, and the second barrier pattern 535 may include a metal nitride, e.g., titanium nitride, tantalum nitride, tungsten nitride, etc.

In some example embodiments, a plurality of second contact plugs 549 may be spaced apart from each other in the first and second directions D1 and D2 on the first region I of the substrate 100, and may be arranged in a honeycomb pattern or a lattice pattern in a plan view. Each of the second contact plugs 549 may have a shape of a circle, an ellipse or a polygon in a plan view.

In some example embodiments, a plurality of first insulation patterns 925 may be spaced apart from each other in the second direction D2 between ones of the bit line structures 395 neighboring in the first direction D1 on the second region II of the substrate 100, and the third capping pattern

940 may be formed between ones of the first insulation patterns 925 neighboring in the second direction D2.

In some example embodiments, the first insulation pattern 925 and the third capping pattern 940 may be formed on the insulation spacer structure 914 on the second region II of the substrate 100. The first insulation pattern 925 may include an oxide, e.g., silicon oxide.

In some example embodiments, the third contact plug 548 may extend through the first insulation pattern 925 and the insulation structure included in the bit line structure 395 to contact an upper surface of the third conductive pattern 265 included in the conductive structure on the second region II of the substrate 100.

Alternatively, the third contact plug 548 may extend through the third capping pattern 940 and the insulation structure included in the bit line structure 395 to contact the upper surface of the third conductive pattern 265 included in the conductive structure on the second region II of the substrate 100.

Alternatively, the third contact plug 548 may extend through the first insulation pattern 925, the third capping pattern 940 and the insulation structure included in the bit line structure 395 to contact the upper surface of the third conductive pattern 265 included in the conductive structure on the second region II of the substrate 100.

In some example embodiments, and as seen in FIGS. 3A and 3B, the third contact plug 548 may include a fourth metal pattern 546 and a third barrier pattern 536 covering a lower surface of the fourth metal pattern 546. The fourth metal pattern 546 and the third barrier pattern 536 may include substantially the same materials as the third metal pattern 545 and the second barrier pattern 535, respectively.

Referring to FIGS. 1, 2, 3A and 3B together with FIGS. 37 to 39 (which are views described in greater detail below), the first insulation pattern structure may include a second insulation pattern 615 on an inner wall of a tenth opening 547, which may extend at least partially through the second contact plug 549, the insulation structure included in the bit line structure 395, and the first, third and fourth spacers 882, 902 and 490. The second insulation pattern 615 may surround the second contact plug 549 in a plan view. A fourth insulation pattern 620 may be on the second insulation pattern 615 and may be in a portion of the tenth opening 547 on the first region I of the substrate 100. The top of the air spacer 895 may be closed by the second insulation pattern 615.

The second insulation pattern structure may include a third insulation pattern 617 on an inner wall of an eleventh opening 545, which may extend partially through the third contact plug 548, the first insulation pattern 925 and the third capping pattern 940. The third insulation pattern 617 may surround the third contact plug 548 in a plan view. A fifth insulation pattern 625 may be on the third insulation pattern 617 and in a portion of the eleventh opening 545 on the second region II of the substrate 100.

Each of the second to fifth insulation patterns 615, 617, 620 and 625 may include an insulating nitride, e.g., silicon nitride, or an oxide, e.g., silicon oxide.

The fourth etch stop layer 630 may be formed on the first and second insulation pattern structures, the second and third contact plugs 549 and 548, the first insulation pattern 925 and the third capping pattern 940. The fourth etch stop layer 630 may include an insulating nitride, e.g., silicon boronitride.

The capacitor 670 may be formed on the second contact plug 549 on the first region I of the substrate 100, and may include a lower electrode 640 having a shape of a cylinder or a pillar, a dielectric layer 650 on a surface of the lower electrode 640, and an upper electrode 660 on the dielectric layer 650.

The lower electrode 640 may include, e.g., a metal, a metal nitride, a metal silicide, doped polysilicon, etc. The dielectric layer 650 may include, e.g., a metal oxide, and the upper electrode 660 may include, e.g., a metal, a metal nitride, a metal silicide, doped silicon-germanium, etc. In some example embodiments, the upper electrode 660 may have a first upper electrode including a metal or a metal nitride and a second upper electrode including doped silicon-germanium.

In the semiconductor device, the insulation spacer structure 914 may be formed on the sidewall of a portion of the bit line structure 395 on the second region II of the substrate 100, and the insulation spacer structure 914 may further include the third insulation spacer 604 when compared to the upper spacer structure 915 on the sidewall of a portion of the bit line structure 395 on the first region I of the substrate 100 so as to have a relatively large thickness.

Thus, as illustrated below with reference to FIGS. 4 to 39, when an etching process for forming a preliminary upper spacer structure 912 and the insulation spacer structure 914 on the sidewall of the bit line structure 395, the conductive structure included in an end portion of the bit line structure 395 on the second region II of the substrate 100 may not be removed, and deterioration of the electric characteristics of the bit line structure 395 may be prevented or lessened.

FIGS. 4 to 39 are plan views and cross-sectional views illustrating a method of manufacturing a semiconductor device in accordance with example embodiments. Particularly, FIGS. 4, 7, 10, 15, 30, 33 and 37 are plan views, FIG. 5 includes cross-sectional views taken along lines A-A' and B-B' of FIG. 4, FIGS. 6, 8, 11, 13, 16, 18, 20, 22, 24, 26, 28, 31-32, 35 and 38 are cross-sectional views taken along lines A-A' of respectively corresponding plan views, and FIGS. 9, 12, 14, 17, 19, 21, 23, 25, 27, 29, 34, 36 and 39 are cross-sectional views taken along lines C-C' of respectively corresponding plan views.

Figure 4:
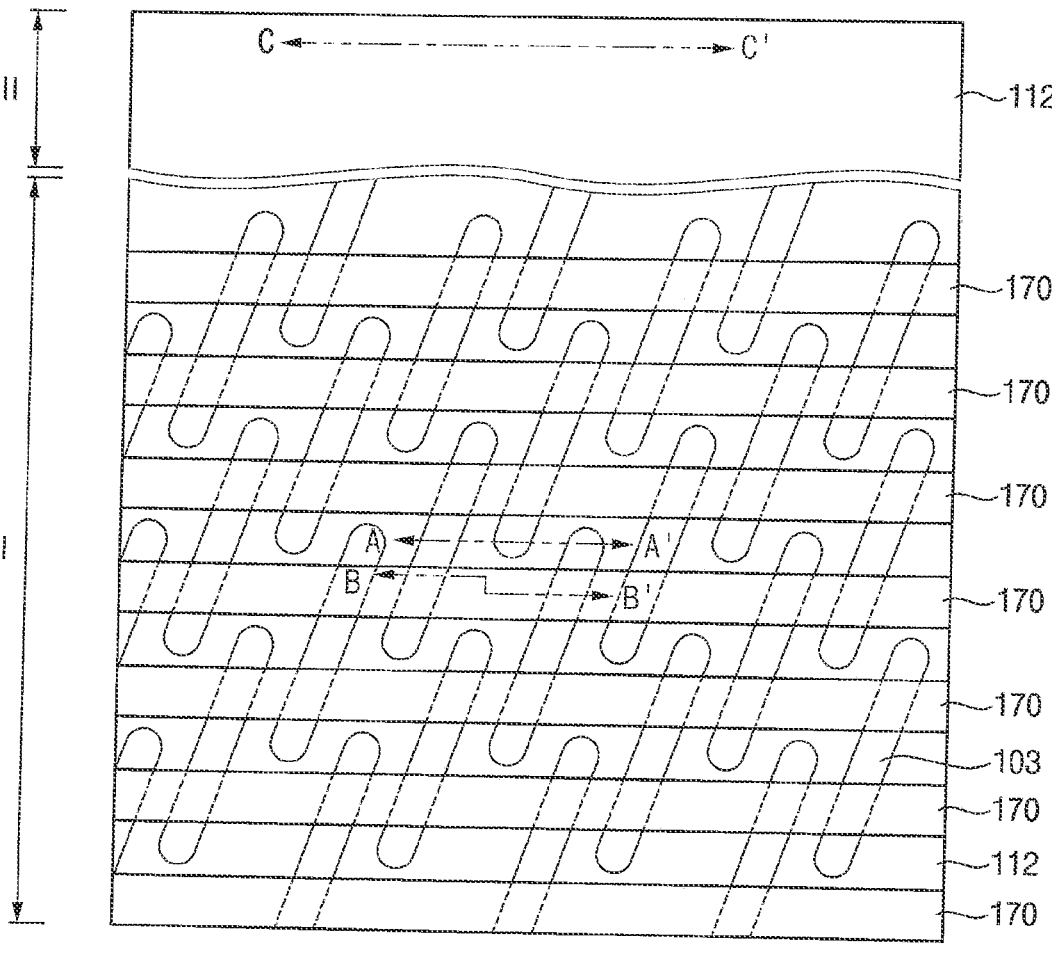
FIGS. 4, 7, 10, 15, 30, 33, and 37 are plan views illustrating portions of a method of manufacturing a semiconductor device in accordance with some example embodiments.
Figure 4:
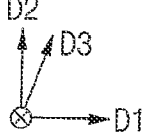
Figure 6:
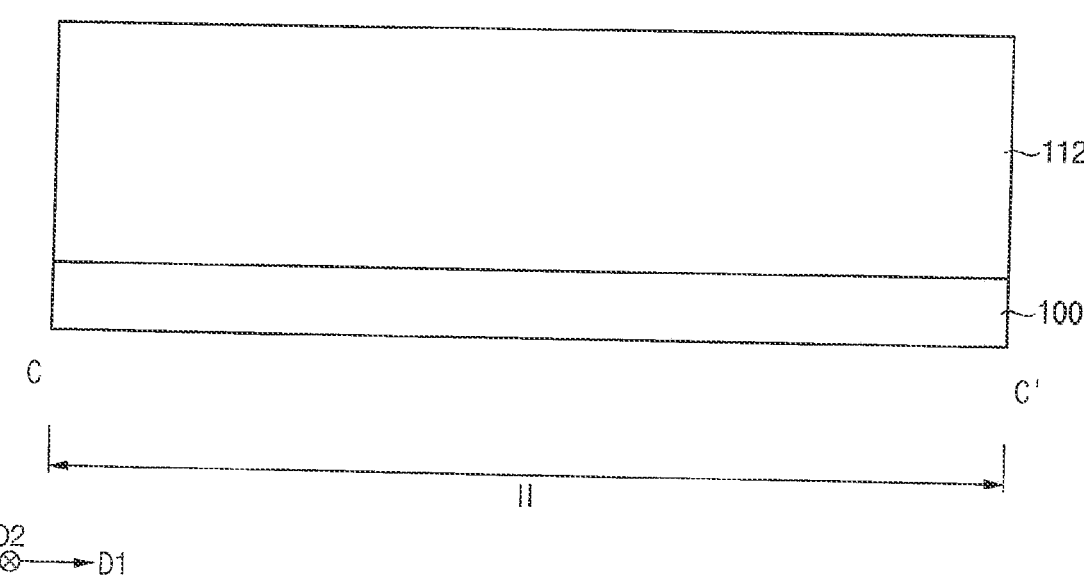

Referring to FIGS. 4 to 6, an active pattern 103 may be formed on a first region I of a substrate 100 including the first region I and a second region II, and an isolation pattern 112 may be formed to cover a sidewall of the active pattern 103.

The active pattern 103 may be formed by removing an upper portion of the substrate 100 to form a first recess. In some example embodiments, the active pattern 103 may extend in the third direction D3 on the first region I of the substrate 100, and a plurality of active patterns 103 may be formed to be spaced apart from each other in the first and second directions D1 and D2. The isolation pattern 112 may be formed on the second region II of the substrate 100.

The active pattern 103 and the isolation pattern 112 on the first region I of the substrate 100 may be partially etched to form a second recess extending in the first direction D1.

A gate structure 170 may be formed in the second recess. In some example embodiments, the gate structure 170 may extend in the first direction D1 on the first region I of the substrate 100, and a plurality of gate structures 170 may be formed to be spaced apart from each other in the second direction D2.

Figure 7:
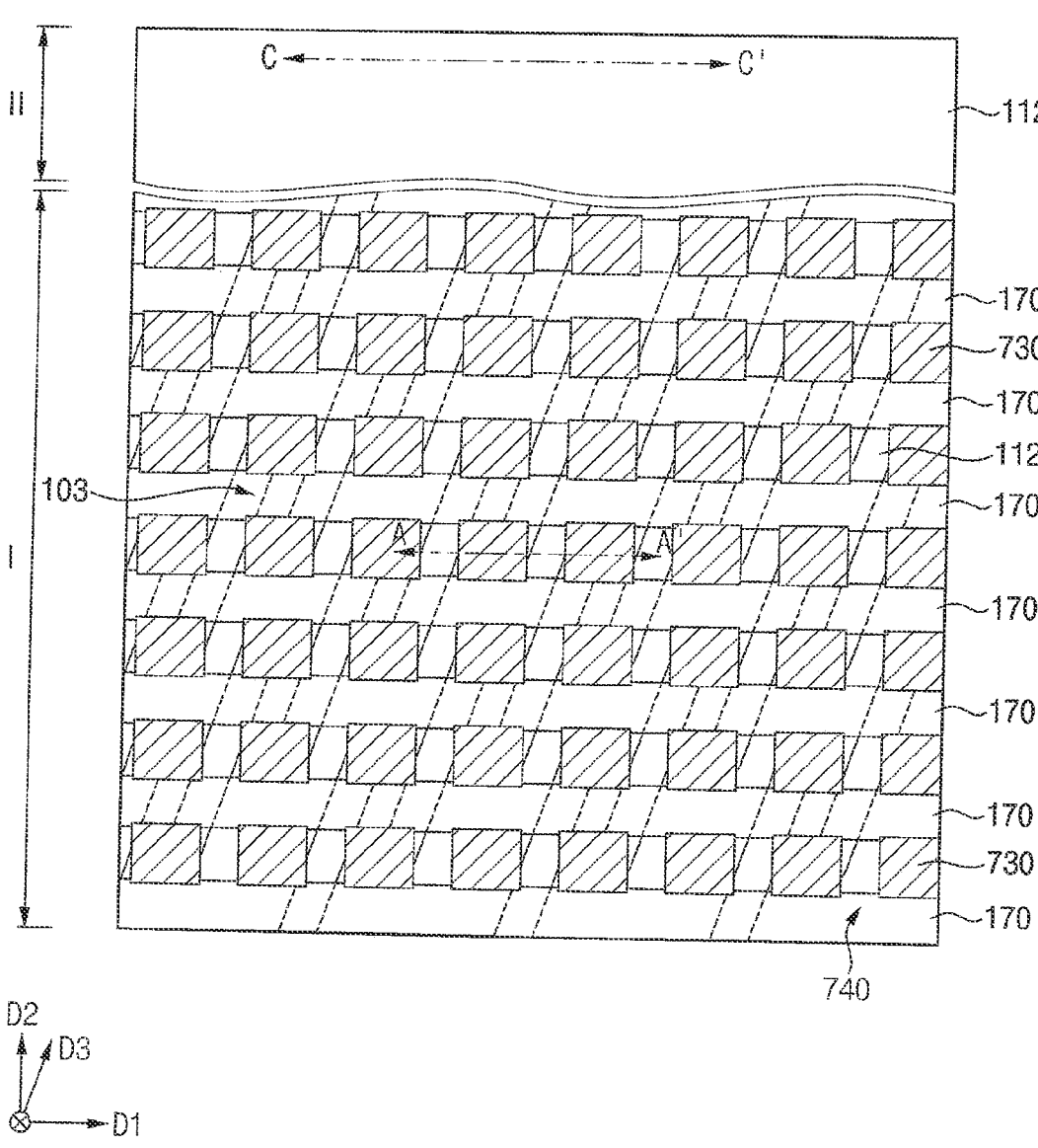
Figure 8:
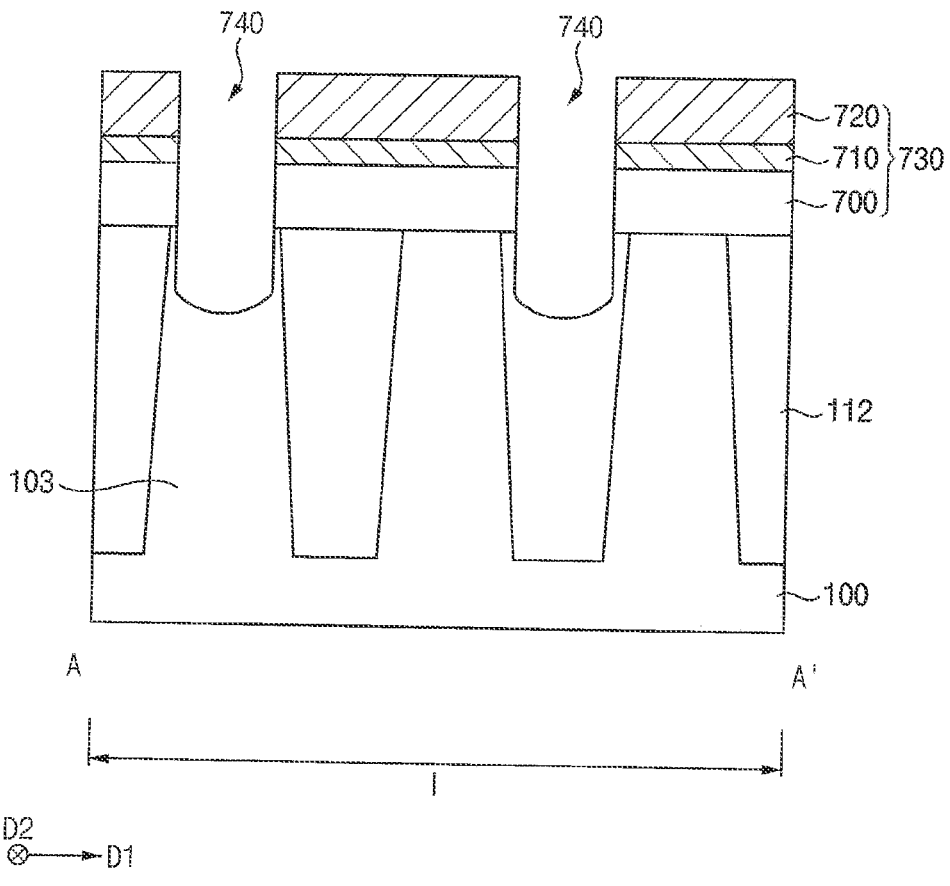
Figure 9:
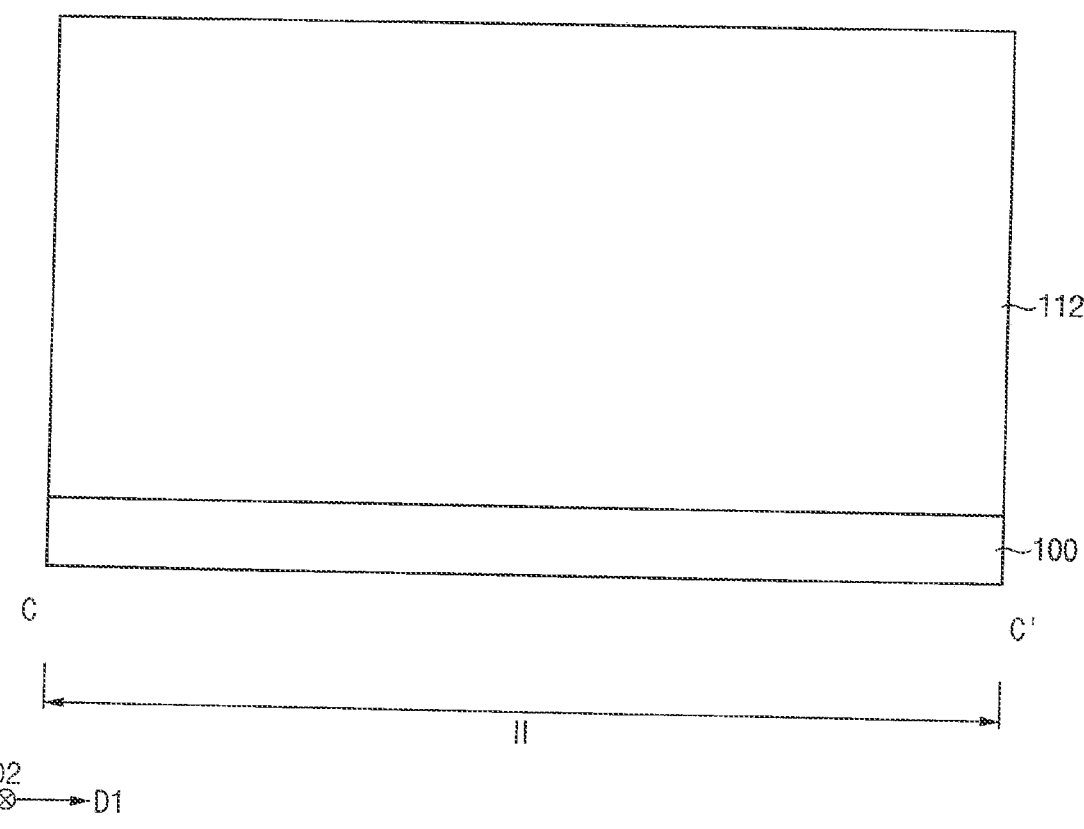

Referring to FIGS. 7 to 9, a conductive pad structure 730 may be formed on the active pattern 103 and the isolation pattern 112.

The conductive pad structure 730 may include first, second and third conductive pads 700, 710 and 720 sequentially stacked in the vertical direction.

A portion of the conductive pad structure 730 on the second region II of the substrate 100 may be removed to form a first opening exposing an upper surface of the isolation pattern 112, an isolation layer may be formed on the isolation pattern and the conductive pad structure 730 to fill the first opening, and the isolation layer may be planarized until an upper surface of the conductive pad structure 730 is exposed.

The planarization process may include a chemical mechanical polishing (CMP) process and/or an etch back process.

In some example embodiments, the isolation layer may include substantially the same material as the isolation pattern 112, and thus may be merged to the isolation pattern 112. Hereinafter, the merged structure may be referred to as the isolation pattern 112. In some example embodiments, an upper surface of the isolation pattern 112 may be substantially coplanar with the upper surface of the conductive pad structure 730.

The conductive pad structure 730 on the first region I of the substrate 100 may be patterned by an etching process to form a second opening 740 that exposes upper surfaces of the active pattern 103, the isolation pattern 112 and the gate structure 170, and during the etching process, upper portions of the active pattern 103 and the isolation pattern 112 may also be partially removed.

In some example embodiments, the second opening 740 may include a first portion that extends in the first direction D1 and a second portion that extends in the second direction D2, which are connected to each other. Thus, as seen in FIG. 7, the conductive pad structures 730 may be spaced apart from each other in the first and second directions D1 and D2, and may be arranged in a lattice pattern in a plan view.

In some example embodiments, the conductive pad structures 730 may overlap in the vertical direction an end portion of each of the active patterns 103 extending in the third direction D3 and a portion of the isolation pattern 112 adjacent thereto in the first direction D1.

Figure 10:
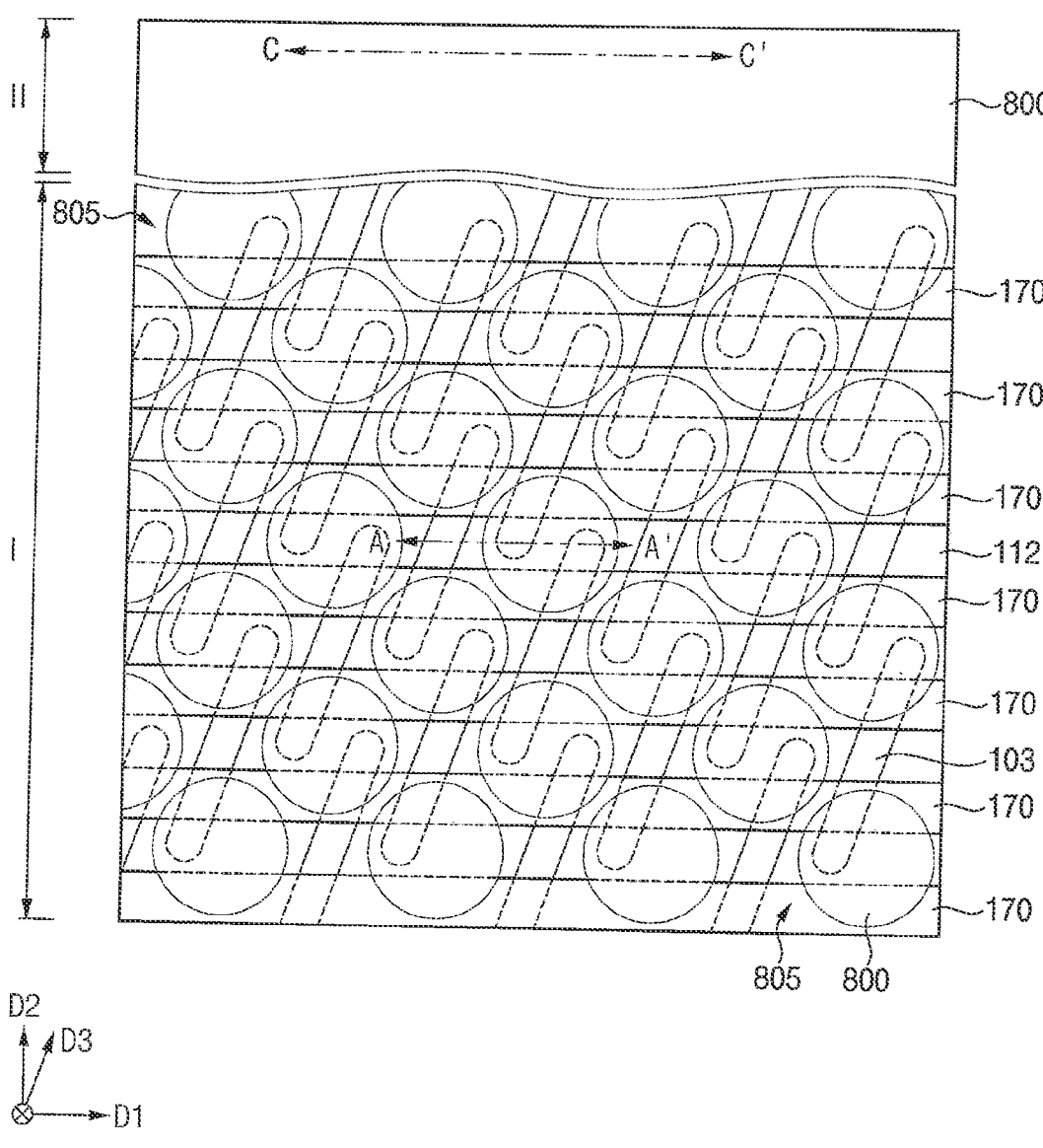
Figure 11:
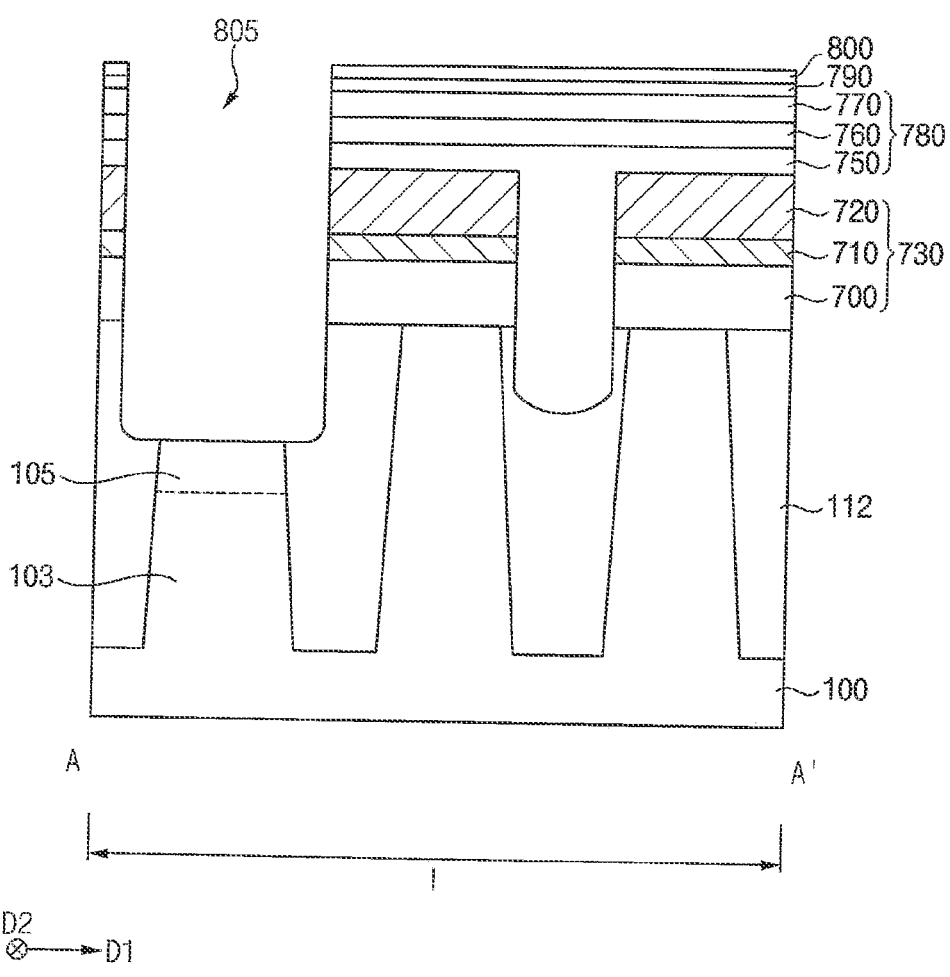
Figure 12:
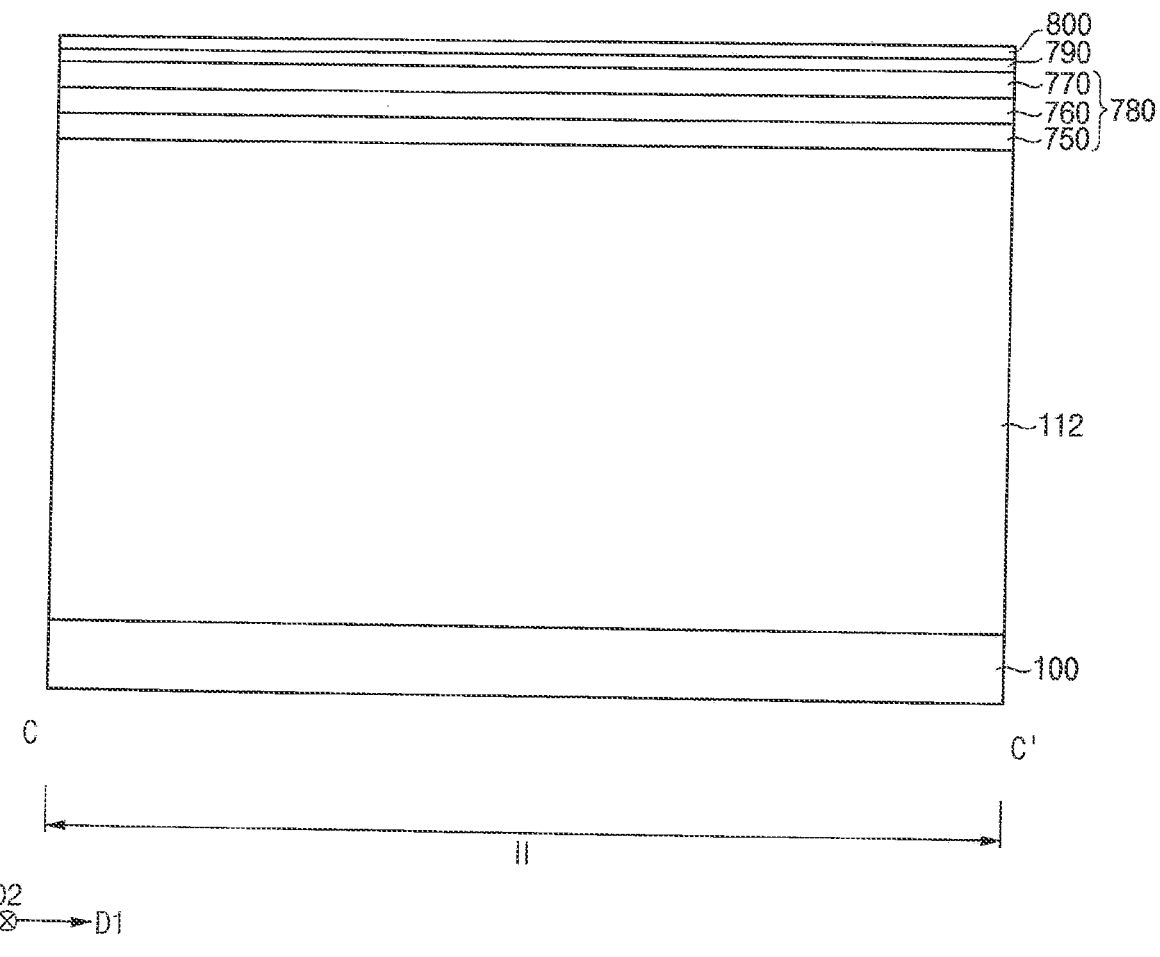

Referring to FIGS. 10 to 12, an insulating pad layer structure 780 may be formed on the conductive pad structure 730 within the second opening 740 and may fill the second opening 740.

In some example embodiments, the insulating pad layer structure 780 may include first, second and third insulation pad layers 750, 760 and 770 sequentially stacked in the vertical direction, and the first insulation pad layer 750 may fill the second opening 740.

First and second etch stop layers 790 and 800 may be sequentially formed on the insulating pad layer structure 780. In some example embodiments, the first etch stop layer 790 may include, e.g., silicon oxynitride, and the second etch stop layer 800 may include, e.g., silicon nitride.

A first mask (not shown) may be formed on the second etch stop layer 800, and the first and second etch stop layers 790 and 800, the insulating pad layer structure 780, the conductive pad structure 730, the active pattern 103, the isolation pattern 112 and the gate mask 160 included in the gate structure 170 on the first region I of the substrate 100 may be partially etched by an etching process using the first mask as an etching mask to form a third opening 805 that partially exposes an upper surface of the active pattern 103.

In some example embodiments, the first mask may cover (e.g., may cover entirely) the second region II of the substrate 100. Additionally, a plurality of first masks each of which may have a shape of a circle or an ellipse in a plan view may be formed on the first region I of the substrate 100. Each of the first masks may overlap in the vertical direction end portions of the active patterns 103 neighboring in the first direction D1 and a portion of the isolation pattern 112 therebetween on the first region I of the substrate 100.

An ion implantation process may be performed on the exposed portion of the active pattern 103 to form an impurity region 105. The impurity region 105 may include n-type or p-type impurities.

The first mask may then be removed.

Figure 13:
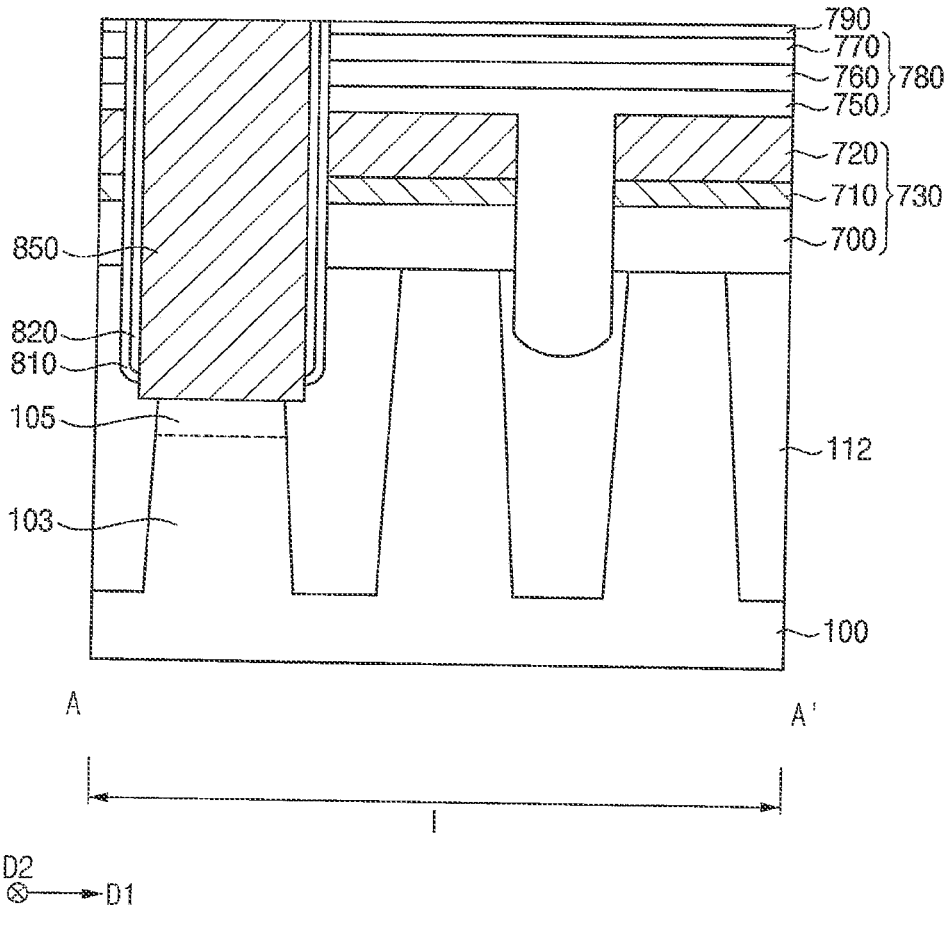
Figure 14:
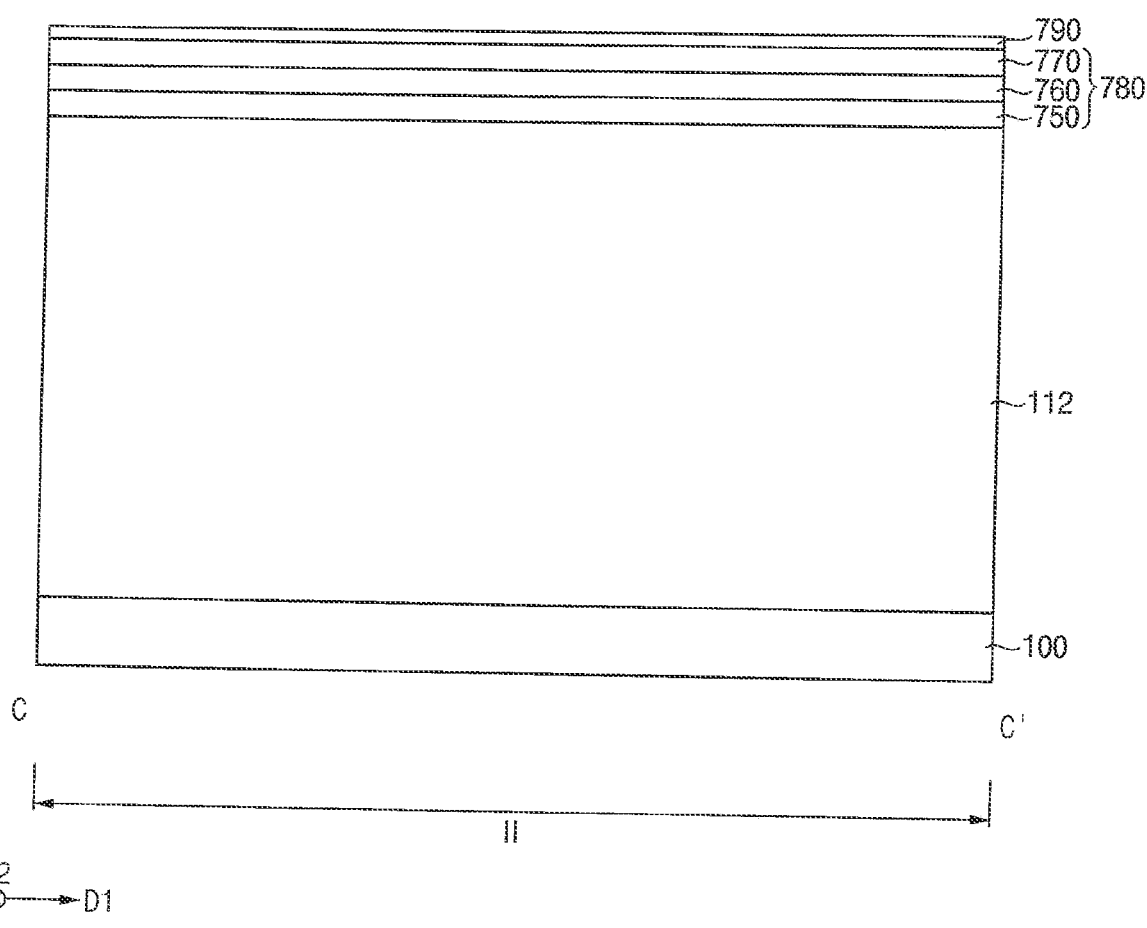

Referring to FIGS. 13 and 14, first and second lower spacer layers may be sequentially formed on a sidewall and a bottom of the third opening 805 and an upper surface of the second etch stop layer 800, and an anisotropic etching process may be performed on the first and second lower spacer layers.

Thus, a lower spacer structure including first and second lower spacers 810 and 820 stacked on the sidewall of the third opening 805 may be formed, and the upper surfaces of the active pattern 103 and the portion of the isolation pattern 112 adjacent to the active pattern 103 may be exposed again.

During the anisotropic etching process, the exposed portions of the active pattern 103 and the isolation pattern 112 may be partially removed, and the second etch stop layer 800 may be partially or entirely removed.

A conductive filling layer may be formed on the exposed portions of the active pattern 103 and the isolation pattern 112 and the first and second etch stop layers 790 and 800 to fill the third opening 805, and may be planarized until an upper surface of the first etch stop layer 790 is exposed. Thus, a conductive filling pattern 850 of which a sidewall is covered by the lower spacer structure may be formed in the third opening 805.

In some example embodiments, the planarization process may include a CMP process and/or an etch back process.

Figure 15:
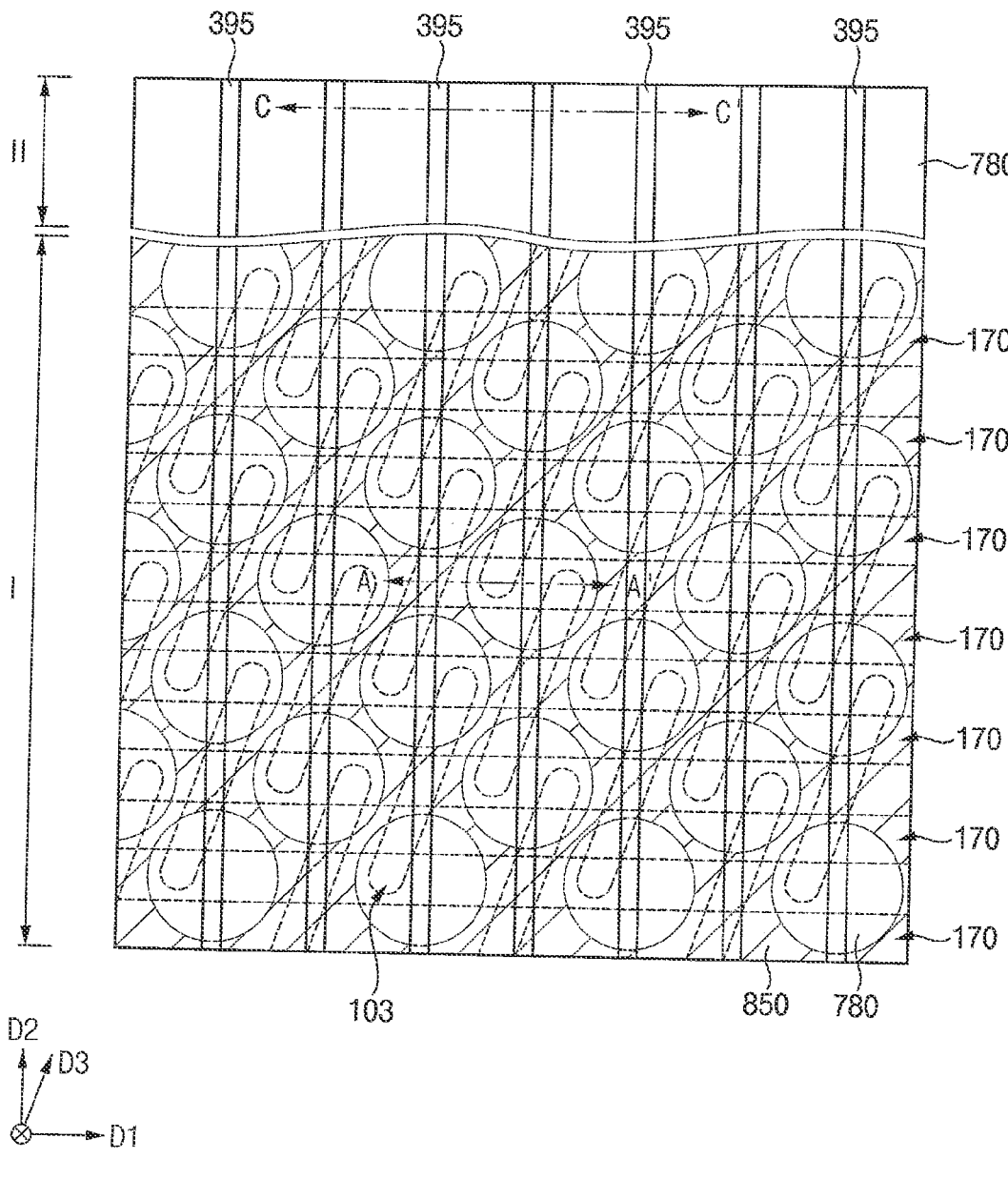
Figure 16:
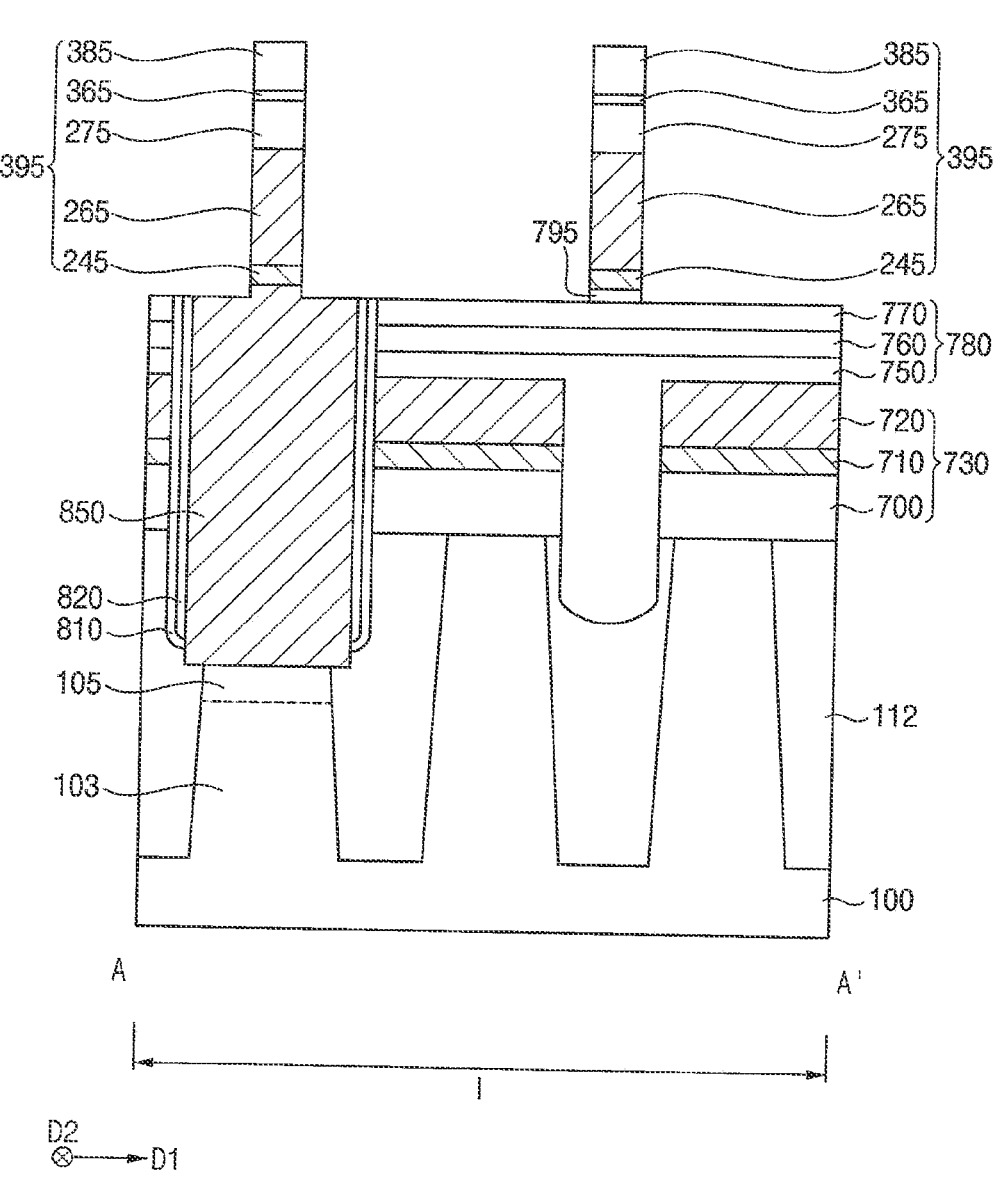
Figure 17:
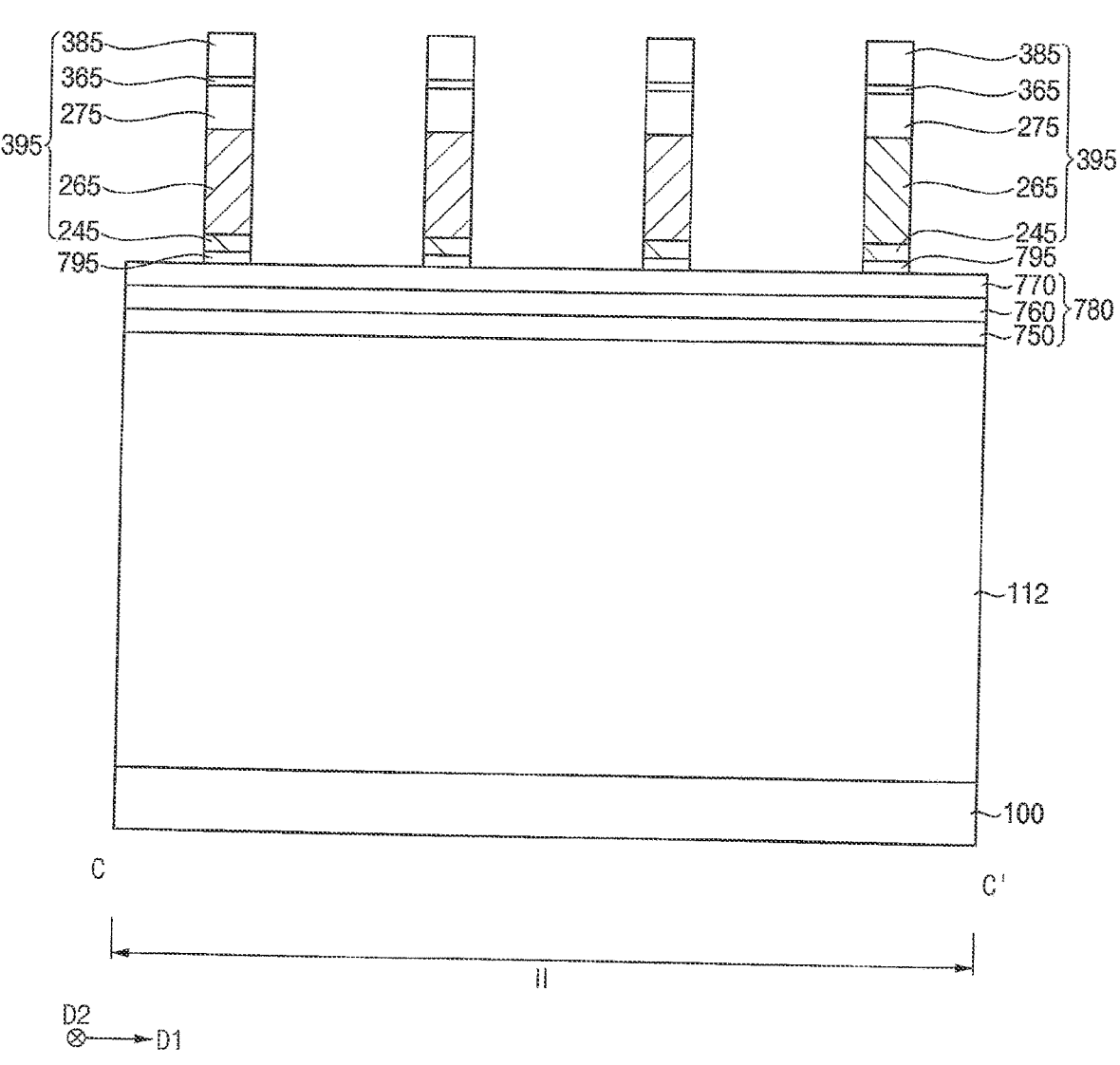

Referring to FIGS. 15 to 17, an adhesion layer, a third conductive layer, a second mask layer, a third etch stop layer, a first capping layer may be sequentially formed on the first etch stop layer 790 and the conductive filling pattern 850, and the first capping layer may be patterned to form a first capping pattern 385, and the third etch stop layer, the second mask layer, the third conductive layer and the adhesion layer may be etched using the first capping pattern 385 as an etching mask.

By the etching process, an adhesion pattern 245, a third conductive pattern 265, a second mask 275, a third etch stop pattern 365 and the first capping pattern 385 may be sequentially stacked on the conductive filling pattern 850 and the insulating pad layer structure 780.

The first etch stop layer 790 under the insulating pad layer structure 780 may be patterned to remain as a first etch stop pattern 795 under the adhesion pattern 245. The adhesion pattern 245 may be formed between the third insulation pad layer 770 that includes an insulating nitride, e.g., silicon nitride and the third conductive pattern 265 that includes a metal, e.g., tungsten, and the adhesion pattern 246 may enhance the adhesion between the third insulation pad layer 770 and the third conductive pattern 265.

Hereinafter, the adhesion pattern 245, the third conductive pattern 265, the second mask 275, the third etch stop pattern 365, and the first capping pattern 385 sequentially stacked may be referred to as a bit line structure 395. The bit line structure 395 may include a conductive structure having the adhesion pattern 245 and the third conductive pattern 265, and an insulation structure having the second mask 275, the third etch stop pattern 365, and the first capping pattern on the conductive structure. In some example embodiments, the second mask 275, the third etch stop pattern 365, and the first capping pattern 385 may be merged to form a single insulation structure.

In some example embodiments, the bit line structure 395 may extend in the second direction D2 on the substrate 100 on the first and second regions I and II of the substrate 100, and a plurality of bit line structures 395 may be spaced apart from each other in the first direction D1.

Figure 18:
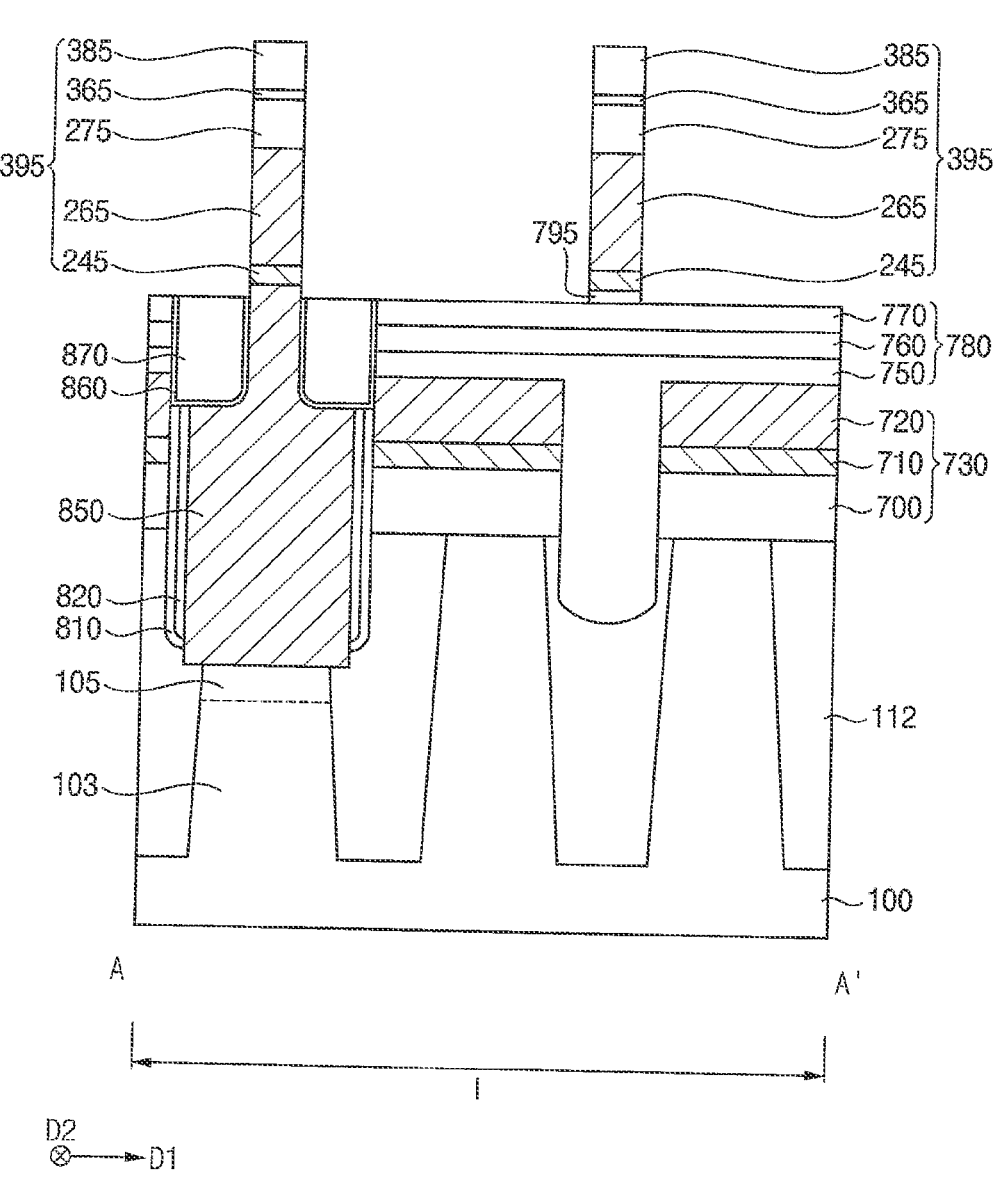
Figure 19:
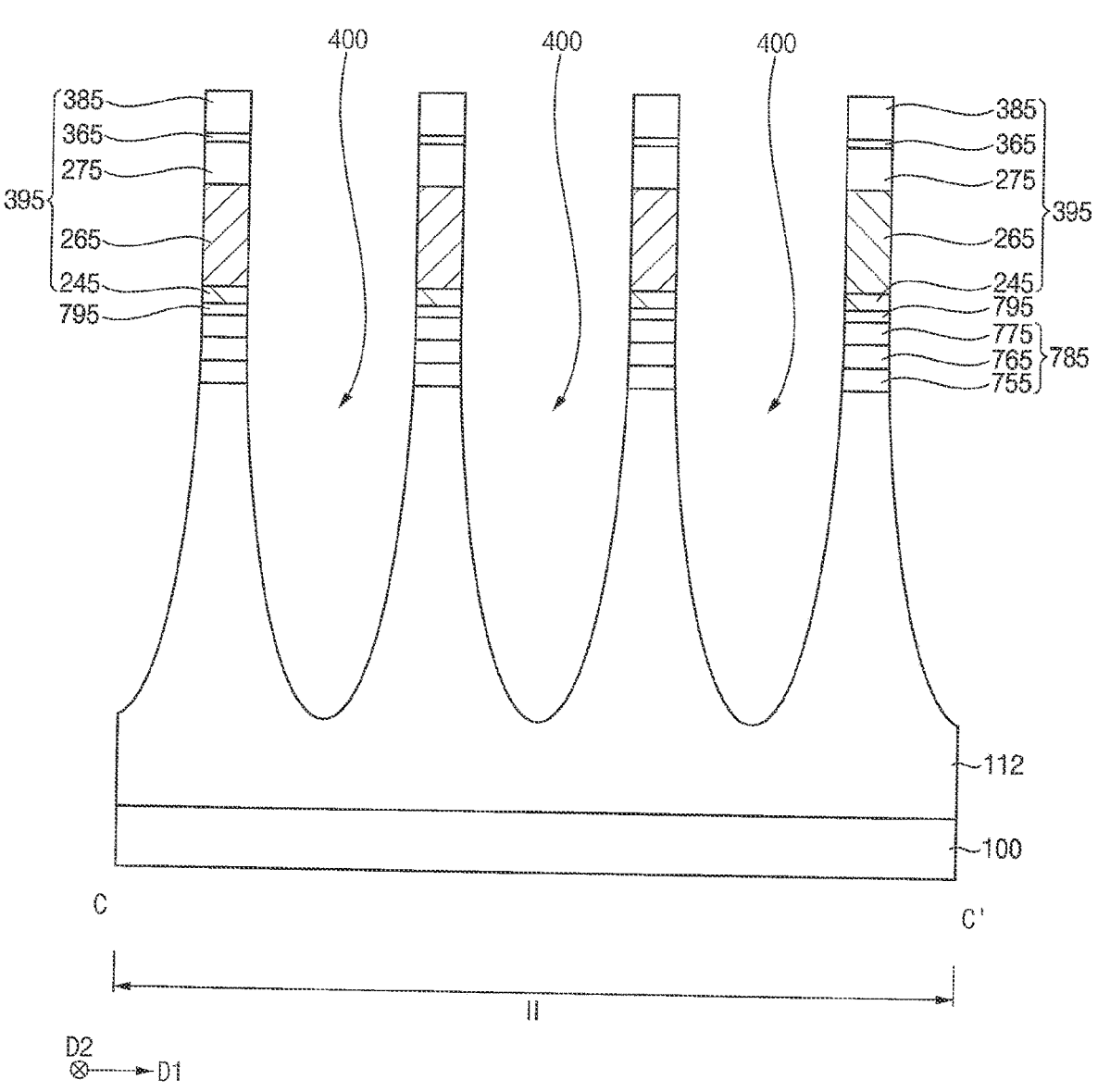

Referring to FIGS. 18 and 19, upper portions of the conductive filling pattern 850 and the first and second lower spacers 810 and 820 that are not covered by the bit line structure 395 may be removed by an etching process to form a third recess.

By the etching process, the conductive filling pattern 850 may include a lower portion having a relatively large width and an upper portion having a relatively small width. In some example embodiments, an upper surface of the lower (wider) portion of the conductive filling pattern 850 may be substantially coplanar with uppermost surfaces of the first and second lower spacers 810 and 820.

A second capping layer may be formed on the bit line structure 395, the conductive filling pattern 850, the first and second lower spacers 810 and 820 and the insulating pad layer structure 780 by, e.g., an atomic layer deposition (ALD) process, an insulating filling layer may be formed on the second capping layer within the third recess, and upper portions of the second capping layer and the insulating filling layer may be removed until an upper surface of the insulating pad layer structure 780 is exposed.

Thus, a second capping pattern 860 may remain on an inner wall of the third recess, and an insulating filling pattern 870 may be formed on the second capping pattern 860. The first and second lower spacers 810 and 820, the conductive and insulating filling patterns 850 and 870 and the second capping pattern 860 may collectively form a filling structure in the third opening 805.

The insulating pad layer structure 780 and the isolation pattern 112 may be etched using the bit line structure 395 and the first etch stop pattern 795 as an etching mask on the second region II of the substrate 100.

Thus, the insulating pad layer structure 780 on the second region II of the substrate 100 may be transformed or modified into an insulation pad structure 785 that includes first, second and third insulation pads 755, 765 and 775 sequentially stacked in the vertical direction. Additionally, a fourth recess 400 may be formed on the isolation pattern 112 on the second region II of the substrate 100.

Figure 20:
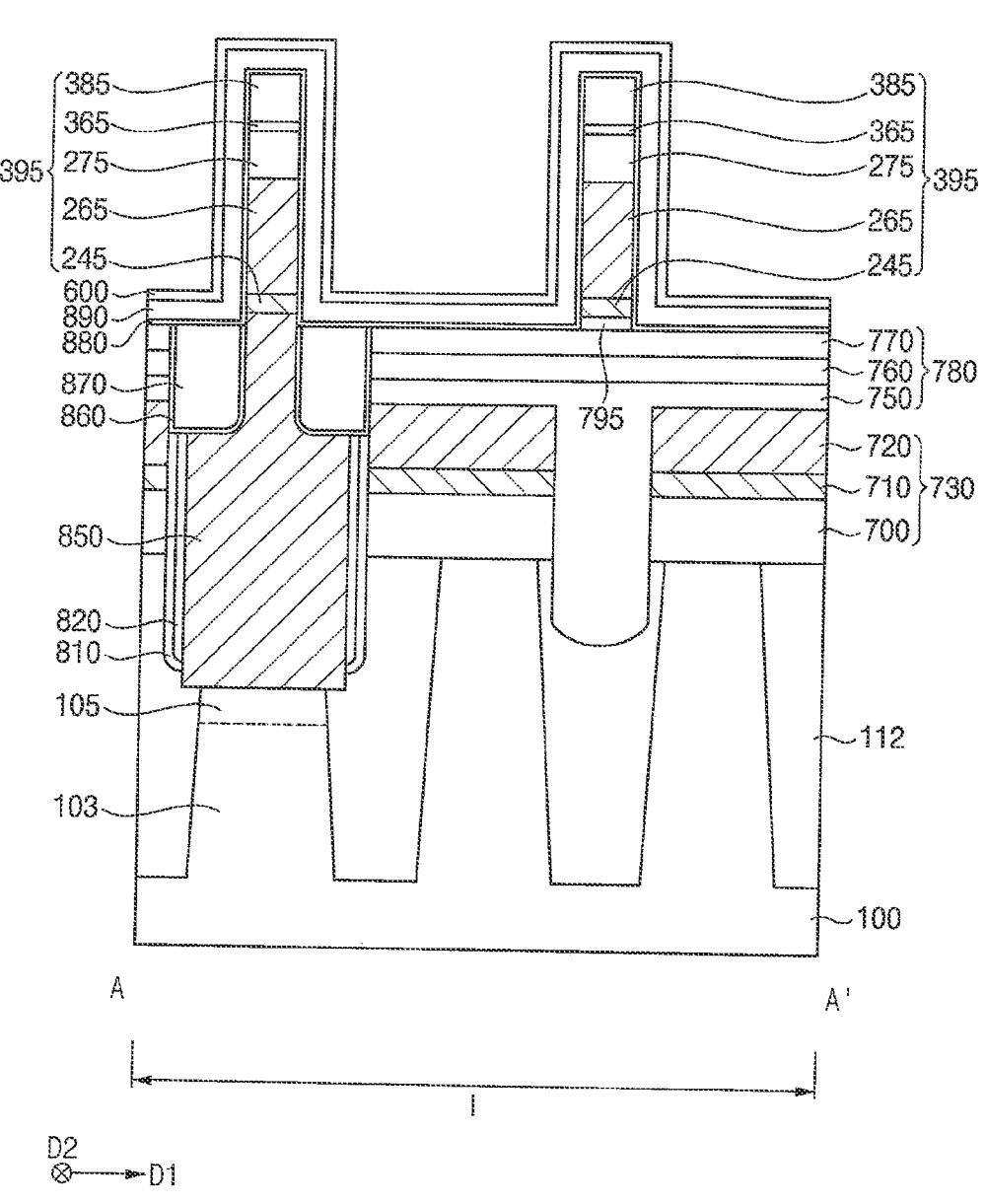
Figure 21:
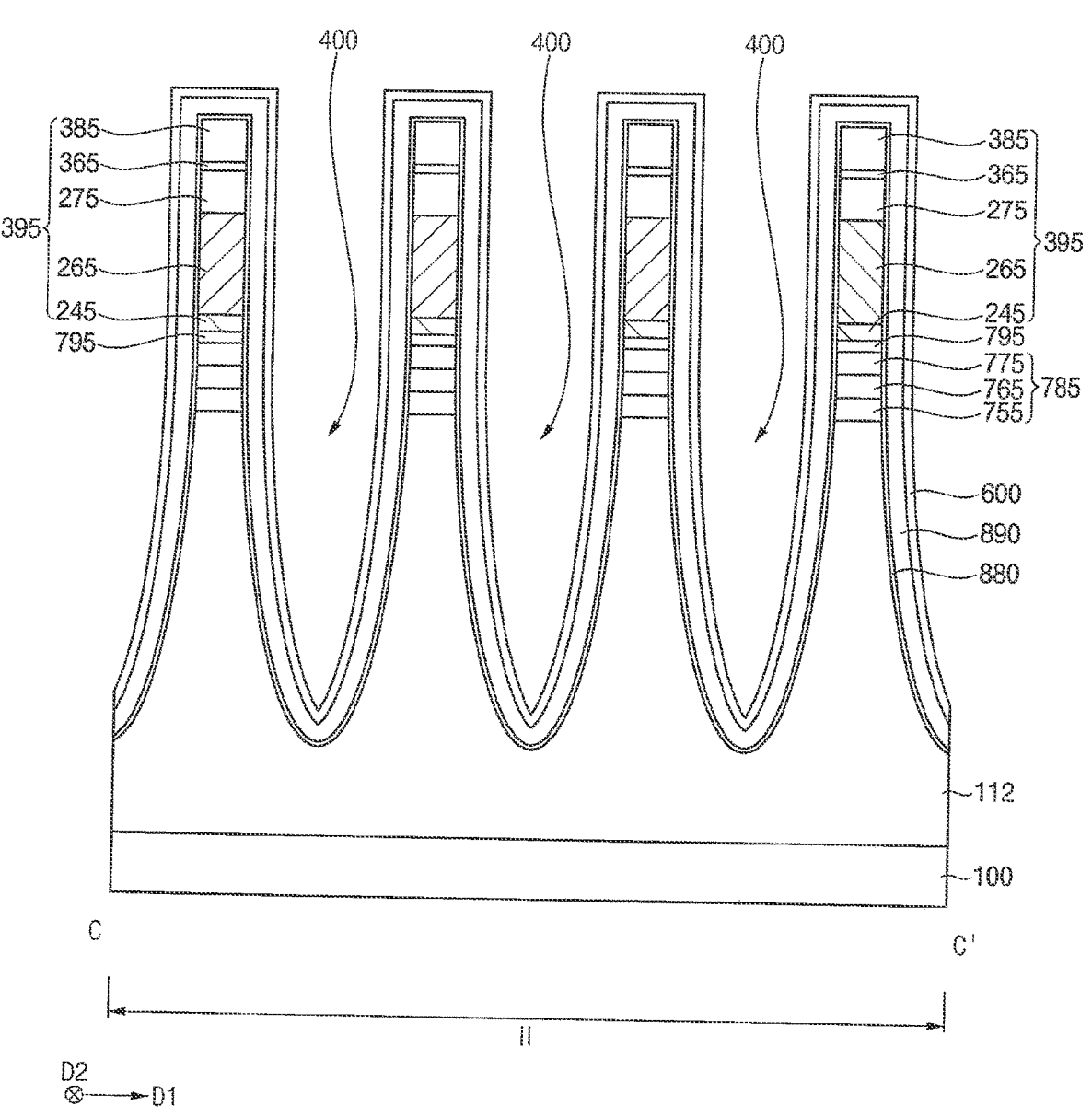

Referring to FIGS. 20 and 21, a first upper spacer layer 880, a second upper spacer layer 890 and a sacrificial spacer layer 600 may be sequentially formed on the bit line structure 395, the first etch stop pattern 795, the insulating pad layer structure 780 and the insulation pad structure 785 on the first and second regions I and II of the substrate 100.

In some example embodiments, the sacrificial spacer layer 600 may include an insulating nitride, e.g., silicon nitride.

Figure 22:
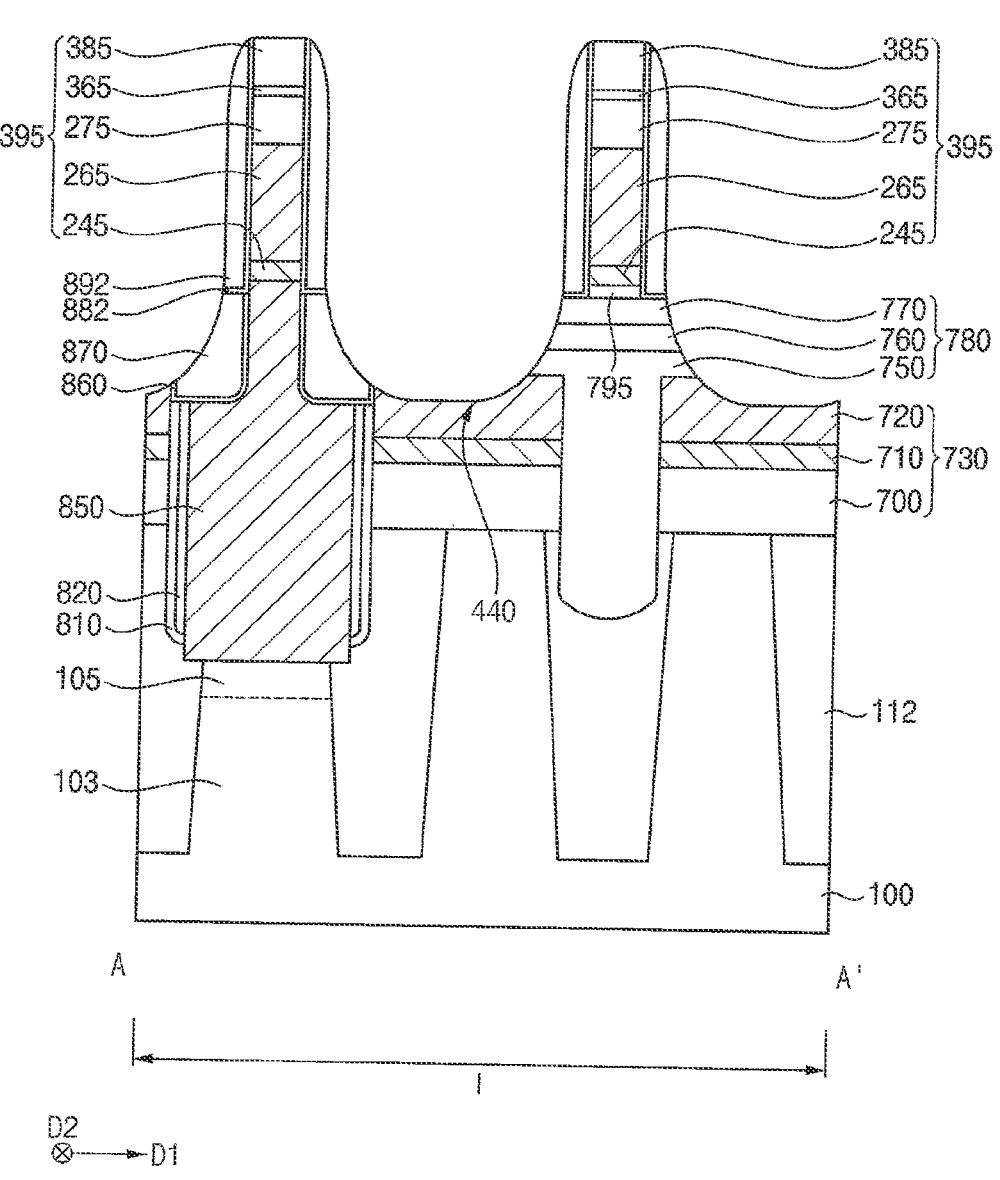
Figure 23:
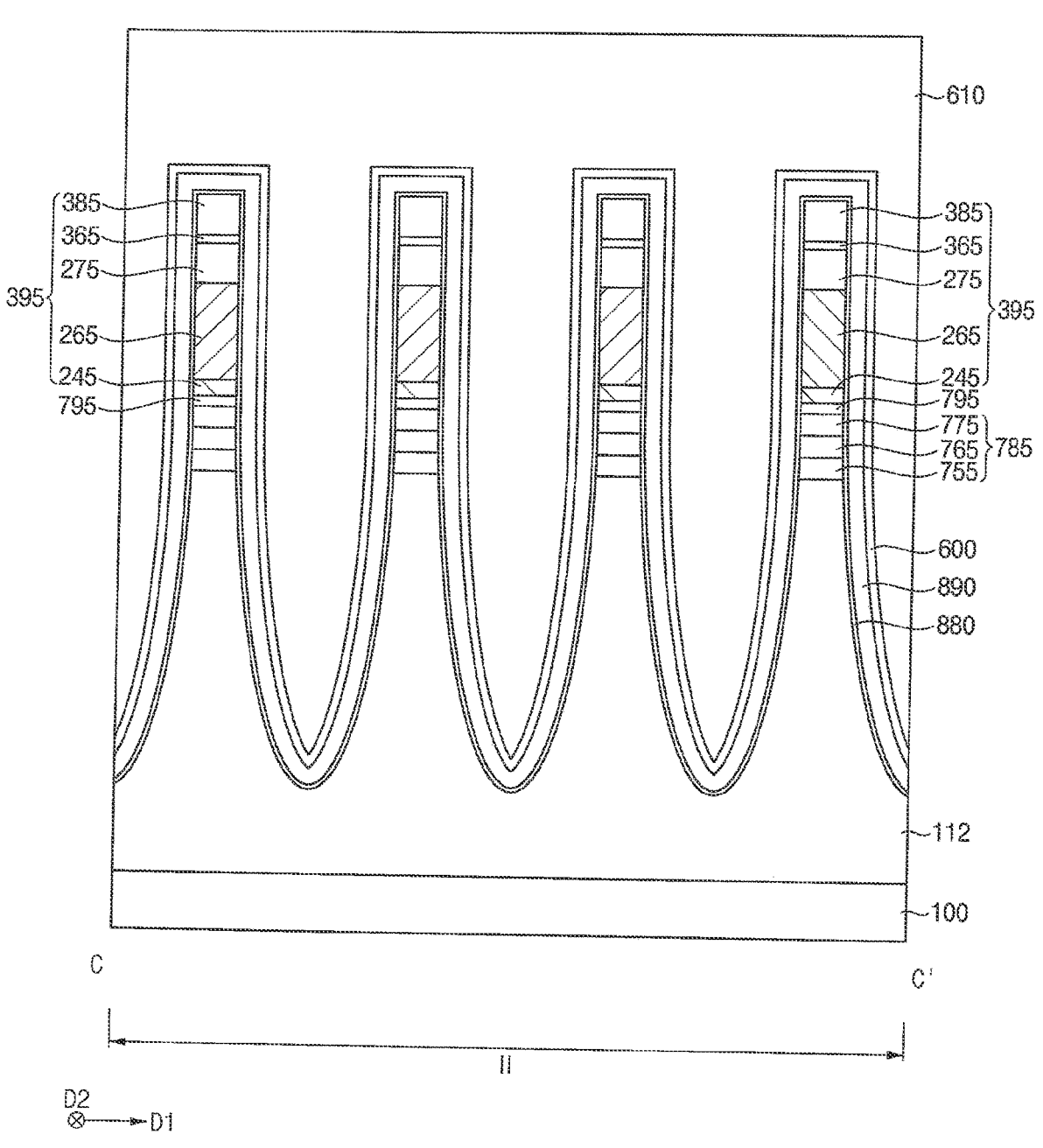

Referring to FIGS. 22 and 23, a third mask 610 may be formed on the sacrificial spacer layer 600, and the sacrificial spacer layer 600, the second upper spacer layer 890 and the first upper spacer layer 880 may be etched on the first region I of the substrate 100.

In some example embodiments, the sacrificial spacer layer 600 may be etched by a wet etching process, and the first and second upper spacer layers 880 and 890 may be etched by a dry etching process, e.g., an anisotropic etching process.

Alternatively, all of the sacrificial spacer layer 600 and the first and second upper spacer layers 880 and 890 may be etched by an anisotropic etching process.

Thus, the sacrificial spacer layer 600 may be removed from the first region I of the substrate 100. Additionally, a first upper spacer 882 may be formed to cover the sidewall of the bit line structure 395 and upper surfaces of portions of the second capping pattern 860 and the insulating filling pattern 870, and a second upper spacer 892 may be formed on an outer sidewall of the first upper spacer 882 on the first region I of the substrate 100.

A dry etching process may be performed on the first region I of the substrate 100 using the bit line structure 395 and the first and second upper spacers 882 and 892 as an etching mask to form a fourth opening 440 extending partially through the second capping pattern 860, the insulating filling pattern 870 and the insulating pad layer structure 780 to partially expose an upper surface of the third conductive pad 720.

Figure 24:
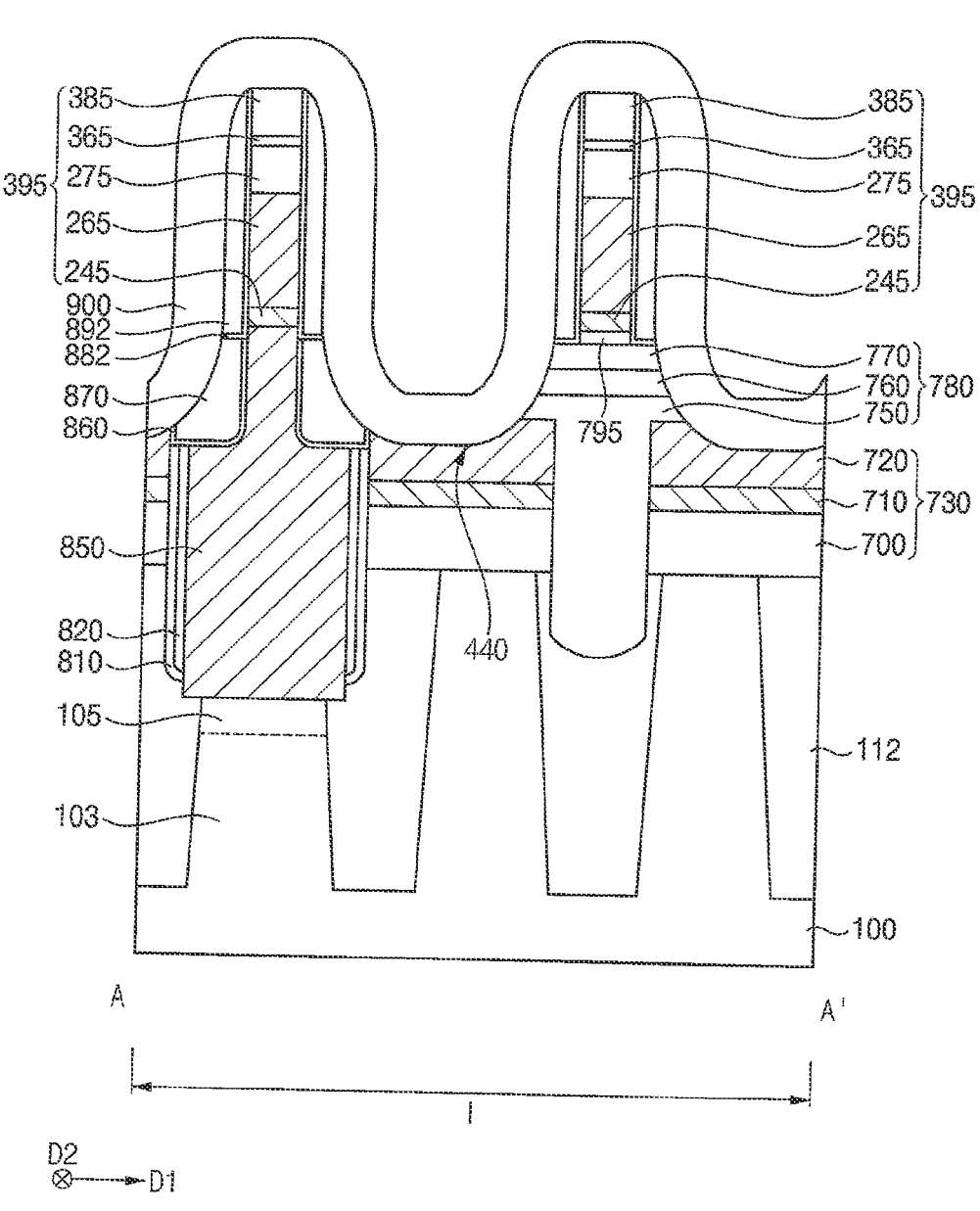
Figure 25:
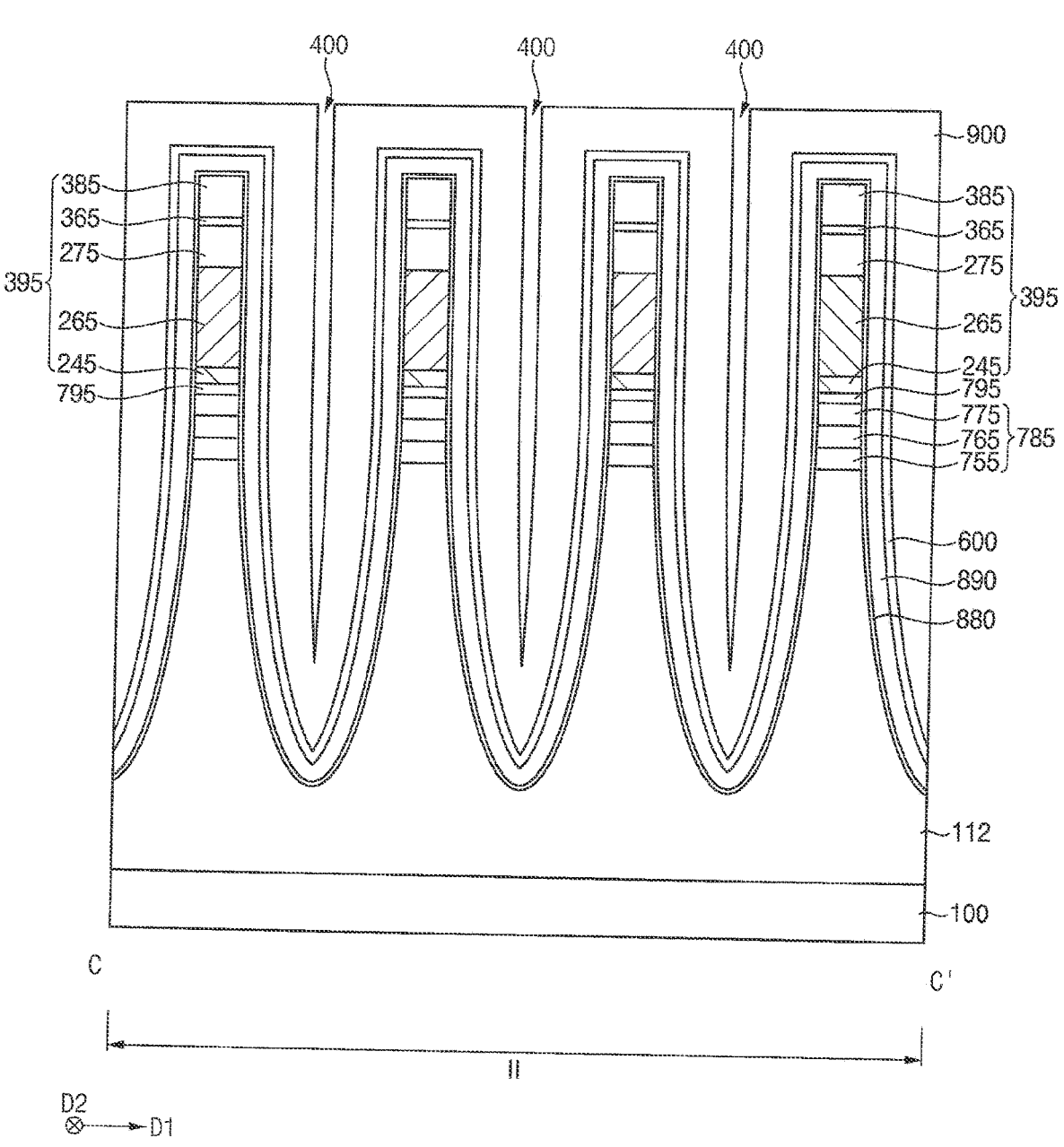

Referring to FIGS. 24 and 25, after removing the third mask 610, a third upper spacer layer 900 may be formed on upper surfaces of the first capping pattern 385 and the first upper spacer 882, an upper surface and an outer sidewall of the second upper spacer 892, an upper surface of a portion of the filling structure, a sidewall of the insulating pad layer structure 780 and the upper surface of the third conductive pad 720 exposed by the fourth opening 440, and the sacrificial spacer layer 600.

In some example embodiments, the third upper spacer layer 900 may not fill the fourth recess 400 completely.

Figure 26:
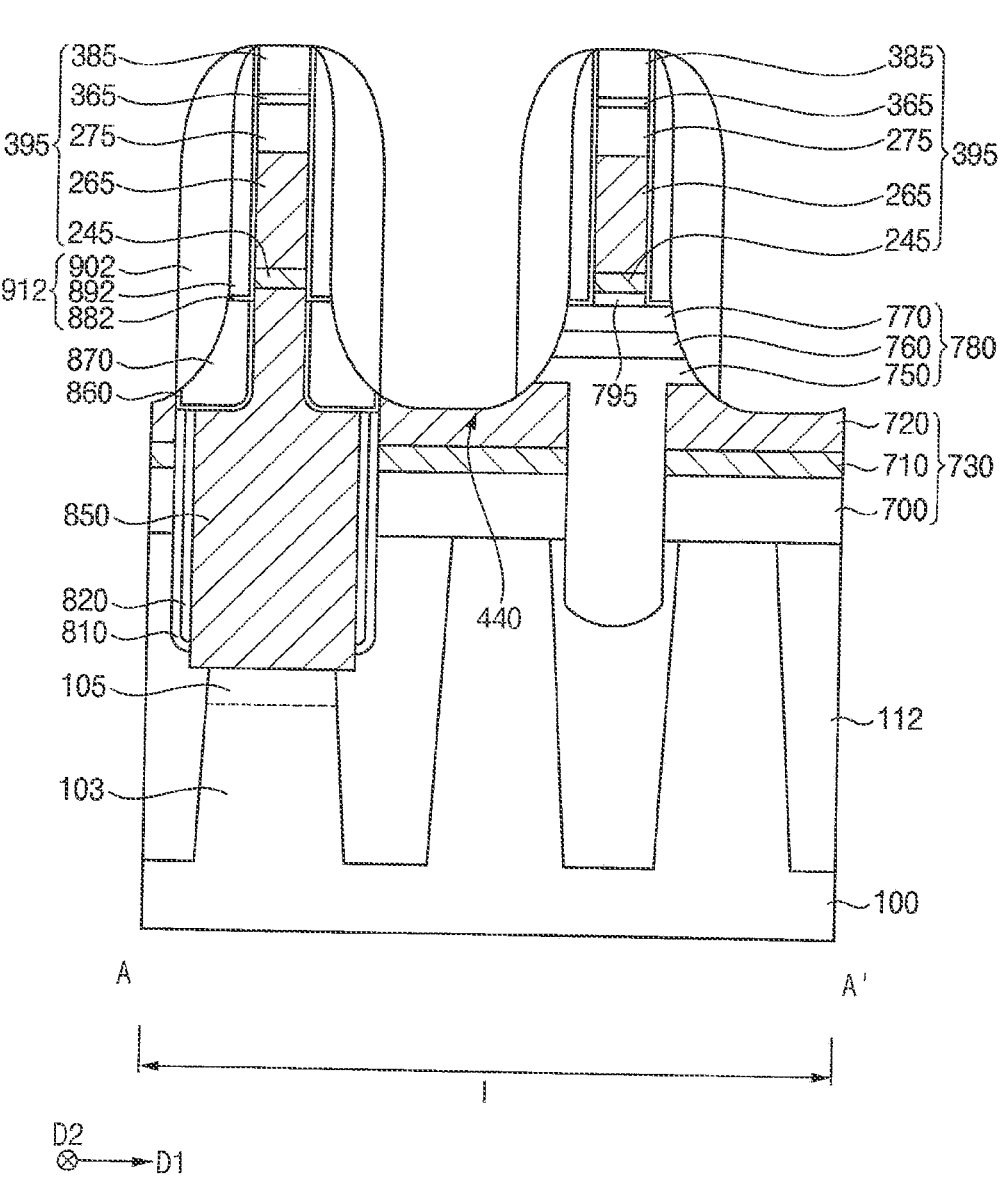
Figure 27:
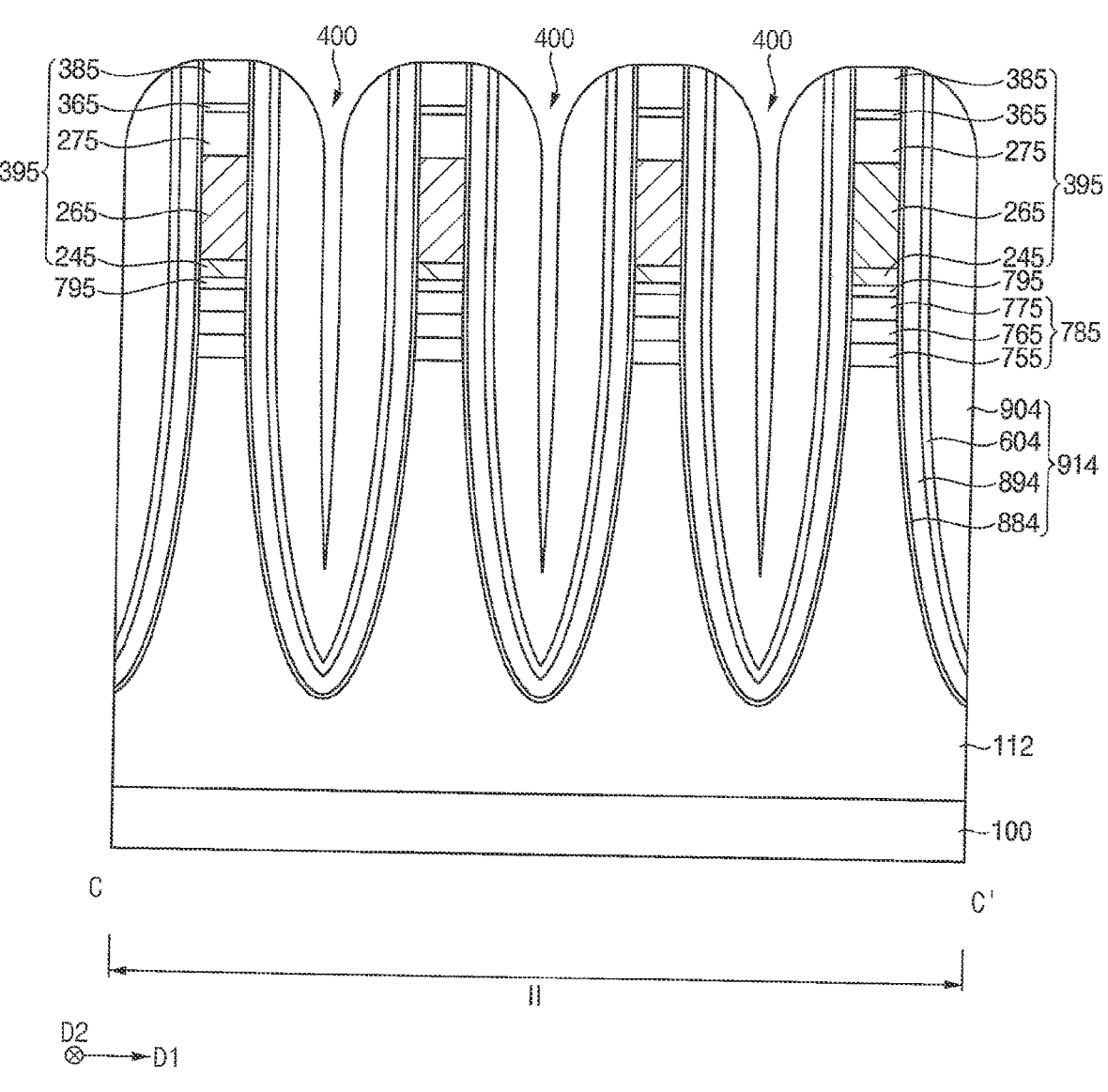

Referring to FIGS. 26 and 27, an anisotropic etching process may be performed on the third upper spacer layer 900.

Thus, a third upper spacer 902 may be formed to cover the outer sidewall of the second upper spacer 892 on the first region I of the substrate 100, and the third spacer 902 may partially cover the upper surface of the filling structure.

The first, second and third upper spacers 882, 892 and 902 sequentially stacked on the sidewall of the bit line structure 395 on the first region I of the substrate 100 may collectively form a preliminary upper spacer structure 912.

An upper portion of the third upper spacer layer 900 may be removed on the second region II of the substrate 100, and portions of the first and second upper spacer layers 880 and 890 and the sacrificial spacer layer 600 on the first capping pattern 385 may also be removed.

Thus, the first and second upper spacer layers 880 and 890 may be transformed into first and second insulation spacers 884 and 894, respectively, and the sacrificial spacer layer 600 may be transformed into a third insulation spacer 604, and the third upper spacer layer 900 may be transformed into a fourth insulation spacer 904. The first to fourth insulation spacers 884, 894, 604 and 904 may collectively form an insulation spacer structure 914.

Figure 28:
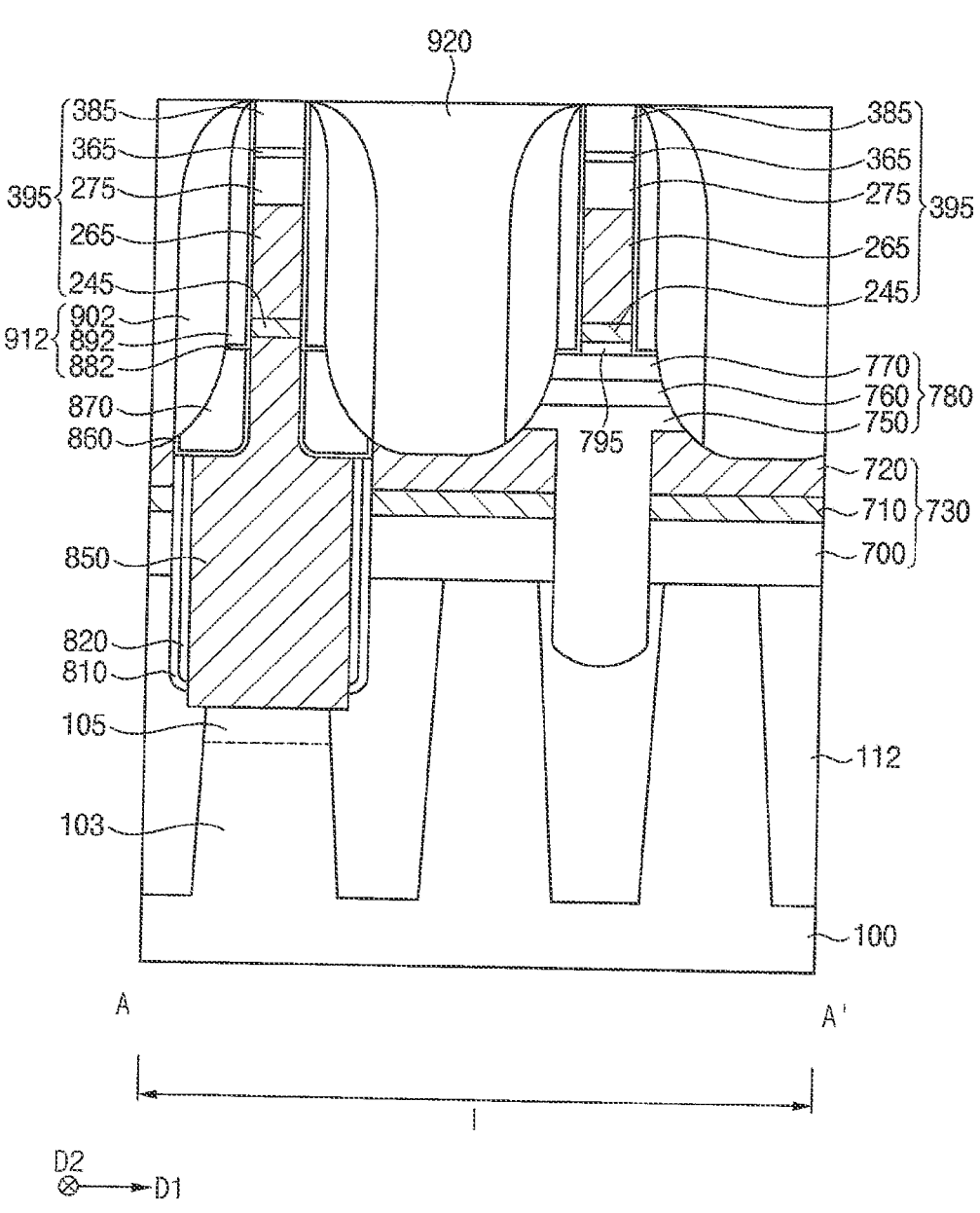
Figure 29:
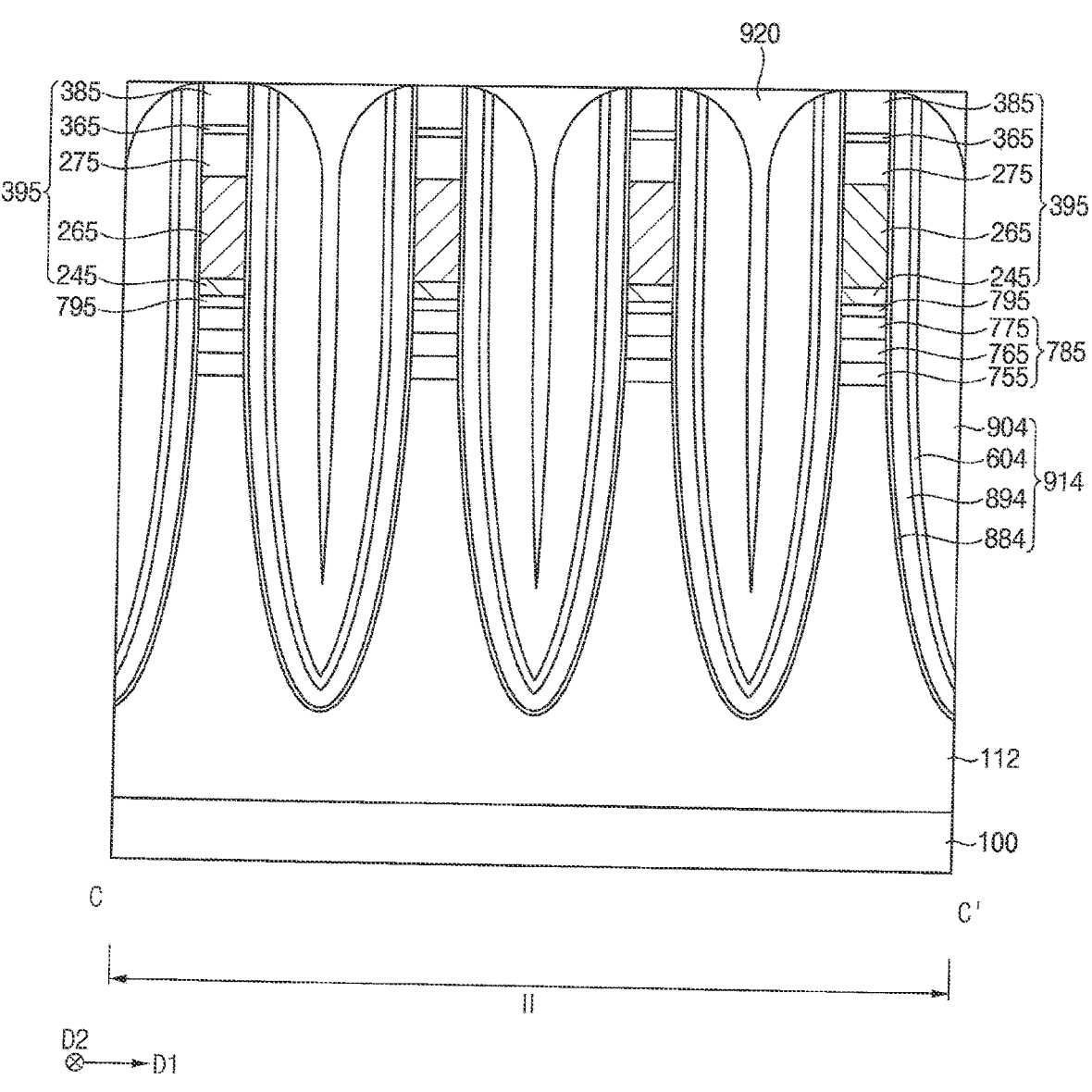

Referring to FIGS. 28 and 29, a first sacrificial layer may be formed on the substrate 100 to fill the fourth opening 440 and the fourth recess 400, and may be planarized until an upper surface of the first capping pattern 385 is exposed to form a first sacrificial pattern 920.

In some example embodiments, the first sacrificial pattern 920 may extend in the second direction D2 on the first and second regions I and II of the substrate 100, and a plurality of first sacrificial patterns 920 may be spaced apart from each other in the first direction D1 by the bit line structure 395. The first sacrificial pattern 920 may include an oxide, e.g., silicon oxide.

Figure 30:
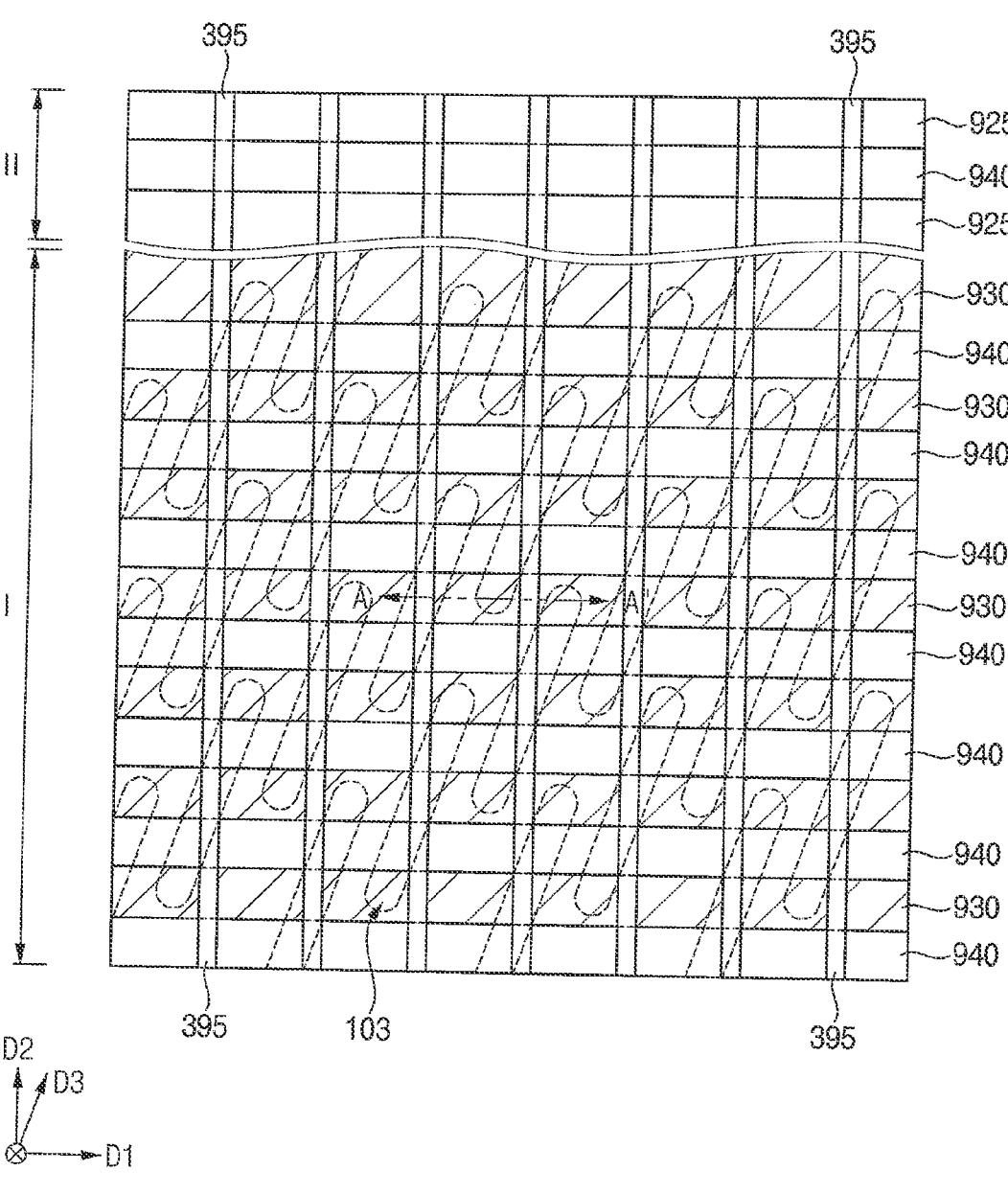
Figure 31:
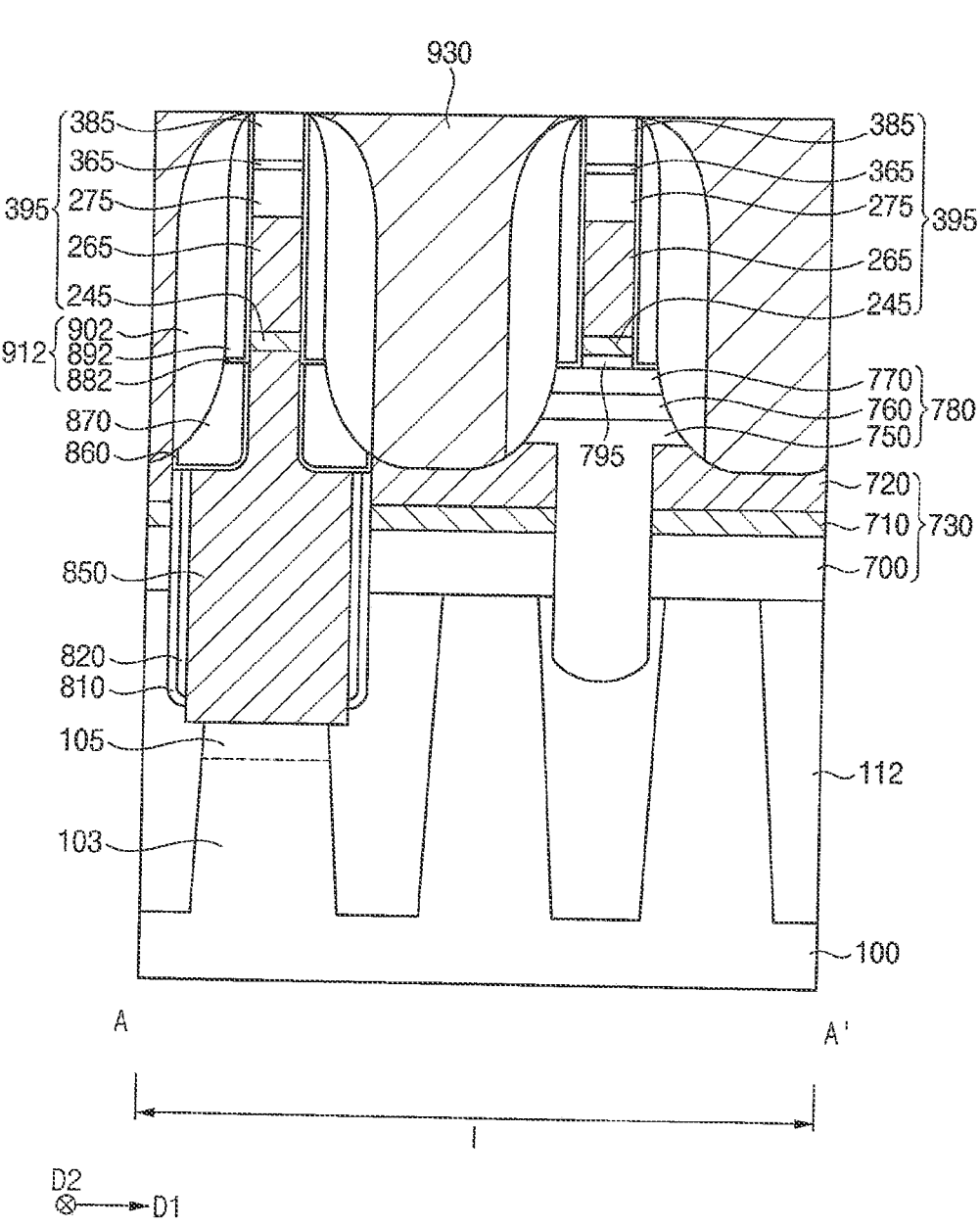

Referring to FIGS. 30 and 31, a fourth mask having a plurality of fifth openings spaced apart from each other in the second direction D2, each of which may extend in the first direction D1, may be formed on the first capping pattern 385, the first sacrificial pattern 920 and the preliminary upper spacer structure 912. The first sacrificial pattern 920 may be etched using the fourth mask as an etching mask. Thus, a sixth opening exposing an upper surface of the gate mask 160 of the gate structure 170 may be formed on the first region I of the substrate 100, and a seventh opening exposing an upper surface of the insulation spacer structure 914 may be formed on the second region II of the substrate 100.

In some example embodiments, the sixth opening may overlap the gate structure 170 in the vertical direction. A plurality of the sixth openings may be spaced apart from each other in the second direction D2 between the bit line structures 395 neighboring in the first direction D1, and plurality of the seventh openings may be spaced apart from each other in the second direction D2 between the bit line structures 395 neighboring in the first direction D1.

After removing the fourth mask, a third capping pattern 940 may be formed to fill the sixth and seventh openings. According to a layout or arrangement of the sixth and seventh openings, a plurality of third capping patterns 940 may be spaced apart from each other in the second direction D2 between the bit line structures 395 neighboring in the first direction D1. The third capping pattern 940 may include an insulating nitride, e.g., silicon nitride.

The plurality of first sacrificial patterns 920 may be spaced apart from each other in the second direction D2 between the bit line structures 395, and each of the first sacrificial patterns 920 may be referred to as a first insulation pattern 925.

A fifth mask (not shown) may be formed on the first insulation pattern 925 and the third capping pattern 940 to cover the second region II of the substrate 100, and the first sacrificial pattern 920 remaining on the first region I of the substrate 100 may be removed to form an eighth opening that partially exposes an upper surface of the third conductive pad 720. A plurality of eighth openings may be spaced apart from each other in the second direction D2 between the bit line structures 395.

After removing the fifth mask, a first contact plug layer may be formed within the eighth openings, and may be planarized until upper surfaces of the first and third capping patterns 385 and 940, the preliminary upper spacer structure 912 and the first insulation pattern 925 are exposed. Accordingly, the first contact plug layer may be divided into a plurality of first contact plugs 930, which may be spaced apart from each other in the second direction D2 by the third capping patterns 940 between the bit line structures 395.

The first contact plug 930 may include, e.g., doped polysilicon, and may be electrically connected to the active pattern 103 by contacting the third conductive pad 720.

Figure 32:
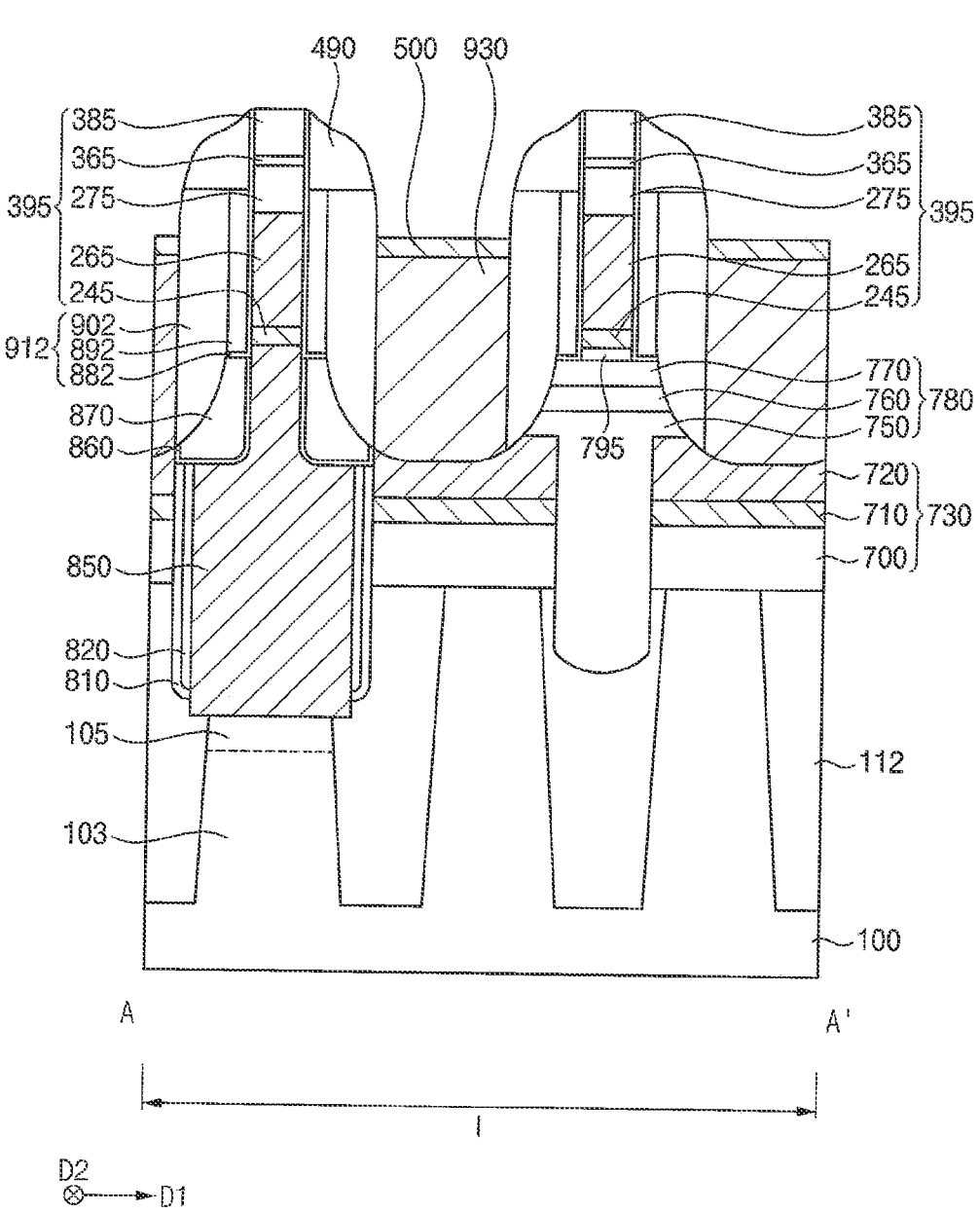

Referring to FIG. 32, an upper portion of the first contact plug 930 may be removed to expose an upper portion of the preliminary upper spacer structure 912 on the sidewall of the bit line structure 395, and upper portions of the second and third upper spacers 892 and 902 of the exposed preliminary upper spacer structure 912 may be removed.

The upper portion of the first contact plug 930 may be removed by, e.g., an etch back process, and the upper portions of the second and third upper spacers 892 and 902 may be removed by, e.g., a wet etching process.

A fourth upper spacer layer may be formed on the bit line structure 395, the preliminary upper spacer structure 912, the first contact plug 930, the third capping pattern 940 and the first insulation pattern 925, and may be anisotropically etched to form a fourth upper spacer 490. The fourth upper spacer 490 may be formed on an outer sidewall of a portion of the first upper spacer 882 on an upper sidewall of the bit line structure 395.

The fourth upper spacer 490 that may be formed by the anisotropic etching process may cover an upper surface of the second upper spacer 892 and at least a portion of an upper surface of the third upper spacer 902. Thus, during the anisotropic etching process, an upper portion of the first contact plug 930 may be partially removed, and a portion of the third upper spacer 902 not covered by the fourth upper spacer 490 may also be removed.

In some example embodiments, a fifth upper spacer layer may be formed on the bit line structure 395, the first upper spacer 882, the fourth upper spacer 490, the first contact plug 930, the third capping pattern 940 and the first insulation pattern 925, and may be further etched to form a fifth upper spacer (not shown) on a sidewall of the fourth upper spacer 490, and the upper portion of the first contact plug 930 may be additionally etched using the bit line structure 395, the first upper spacer 882, the fourth upper spacer 490, the first contact plug 475, the third capping pattern 940 and the first insulation pattern 925 as an etching mask. Thus, an upper surface of the first contact plug 930 may be lower than uppermost surfaces of the second and third upper spacers 892 and 902.

An ohmic contact pattern 500 may be formed on the upper surface of the first contact plug 930. In some example embodiments, the ohmic contact pattern 500 may be formed by forming a first metal layer on the bit line structure 395, the first upper spacer 882, the fourth upper spacer 490, the first contact plug 930, the third capping pattern 940 and the first insulation pattern 925, and performing a heat treatment on the first metal layer, that is, by performing a silicidation process in which the first metal layer including a metal and the first contact plug 930 including silicon are reacted with each other, and removing an unreacted portion of the first metal layer.

The ohmic contact pattern 500 may include a metal silicide, e.g., cobalt silicide, nickel silicide, titanium silicide, etc.

Figure 33:
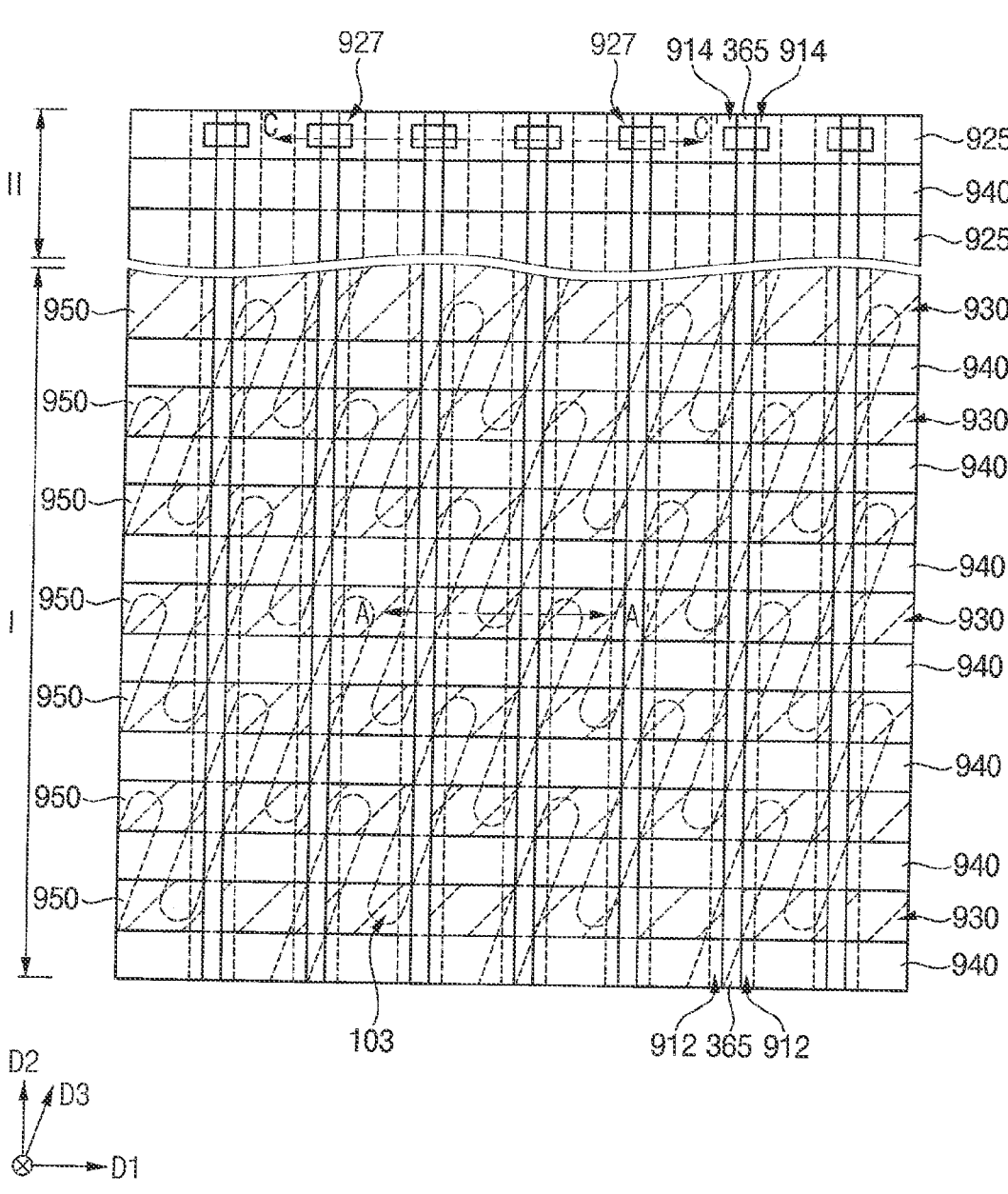
Figure 34:
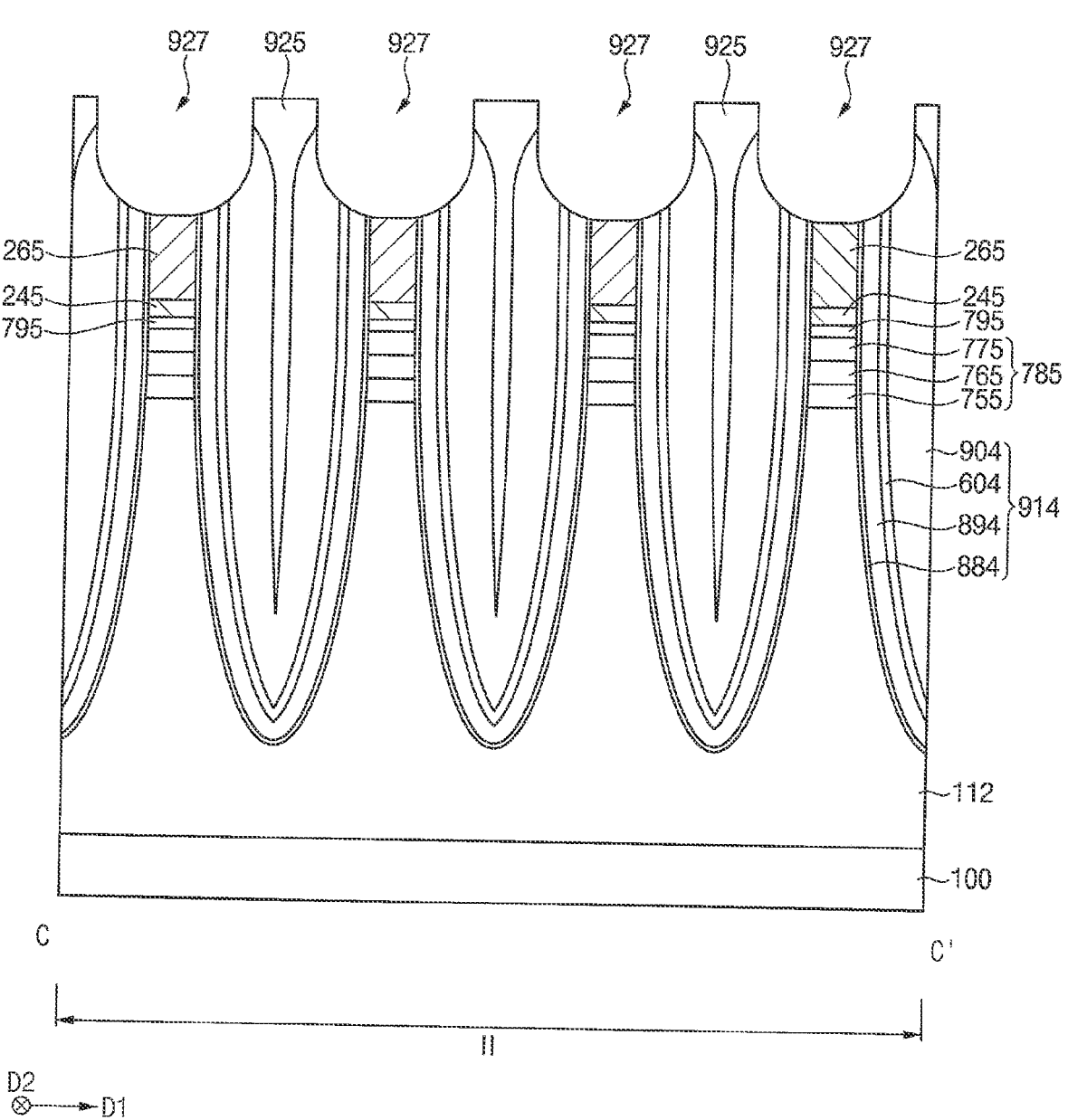

Referring to FIGS. 33 and 34, a second sacrificial layer may be formed on the bit line structure 395, the first upper spacer 882, the fourth upper spacer 490, the ohmic contact pattern 500, the third capping pattern 940 and the first insulation pattern 925. The second sacrificial layer may be planarized until an upper surface of the first insulation pattern 925 is exposed to form a second sacrificial pattern 950 on the first region I of the substrate 100.

The second sacrificial pattern 950 may include, e.g., spin-on-hardmask (SOH) or amorphous carbon layer (ACL).

The insulation structure included in the bit line structure 395 on the second region II of the substrate 100 may be removed to form a ninth opening exposing an upper surface of the third conductive pattern 265 included in the conductive structure. When the insulation structure is removed, portions of the insulation spacer structure 914 and the first insulation pattern 925 adjacent thereto may also be removed.

The ninth opening 927 may be formed by removing an area where the third capping pattern 940 is formed instead of an area where the first insulation pattern 925 is formed, and in this case, a portion of the third capping pattern 940 adjacent to the bit line structure 395, instead of the portion of the first insulation pattern 925 adjacent to the bit line structure 395, may be removed. Alternatively, the ninth opening 927 may be formed by removing both of the portions of the first insulation pattern 925 and the third capping pattern 940 adjacent to the bit line structure 395.

Figure 35:
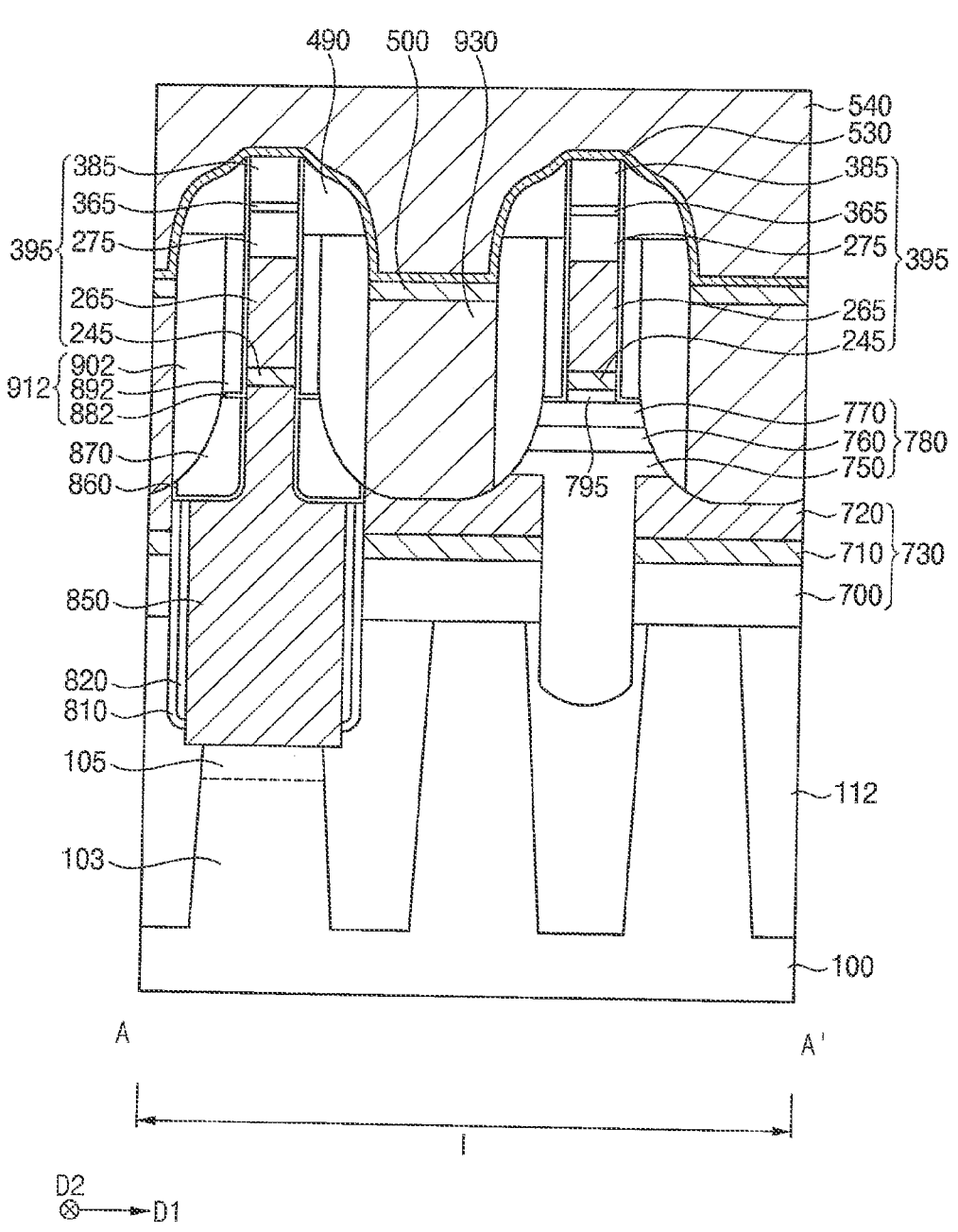
Figure 36:
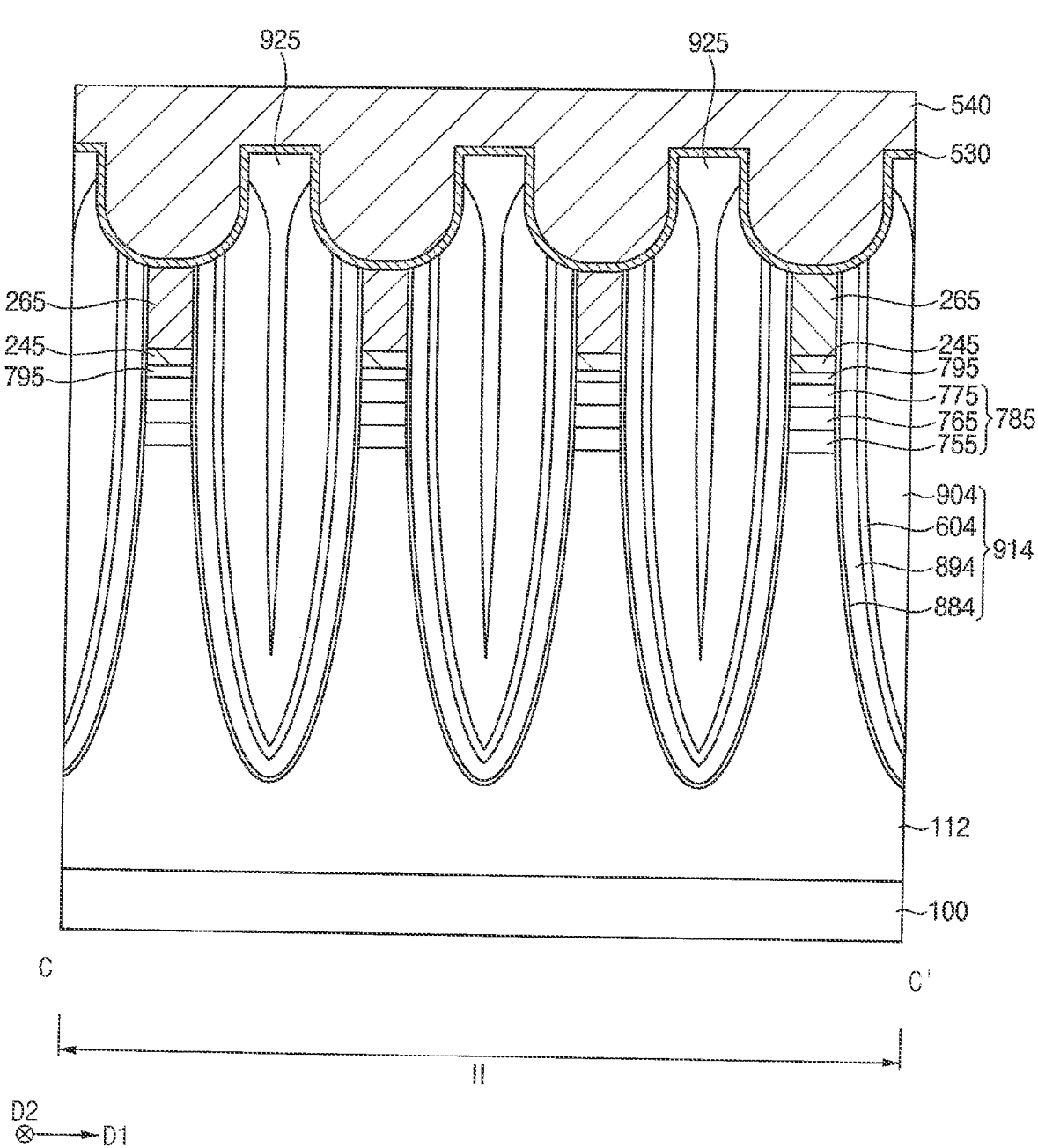

Referring to FIGS. 35 and 36, the second sacrificial pattern 950 may be removed by, e.g., an ashing process and/or a stripping process, a second barrier layer may be formed on the bit line structure 395, the first upper spacer 882, the fourth upper spacer 490, the ohmic contact pattern 500, third capping pattern 940 and the first insulation pattern 925, and a second metal layer 540 may be formed on the second barrier layer 530 to fill a space between the bit line structures 395 and the ninth opening 927.

A planarization process may be performed on an upper portion of the second metal layer 540. The planarization process may include a CHIP process and/or an etch back process.

Figure 37:
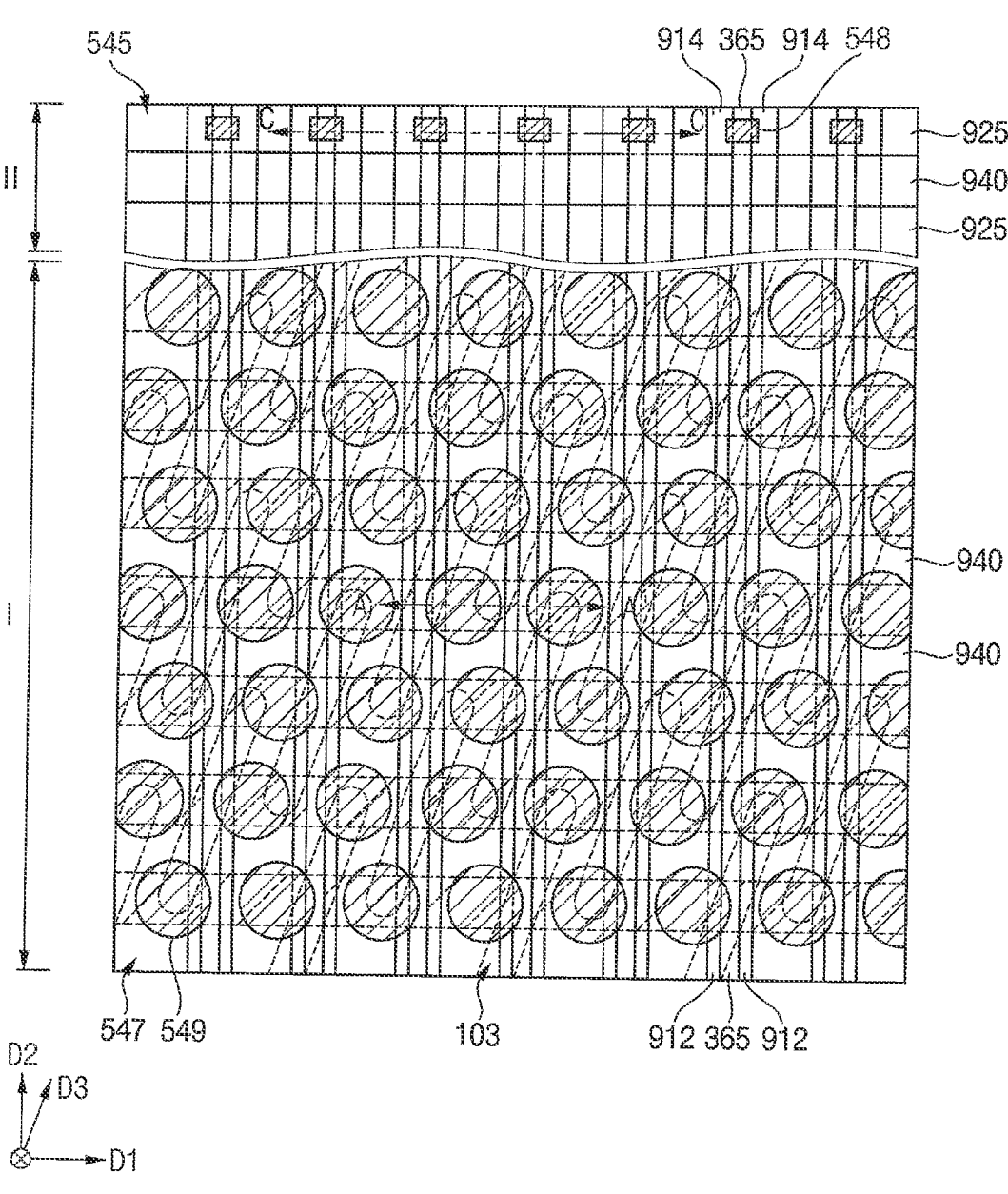
Figure 38:
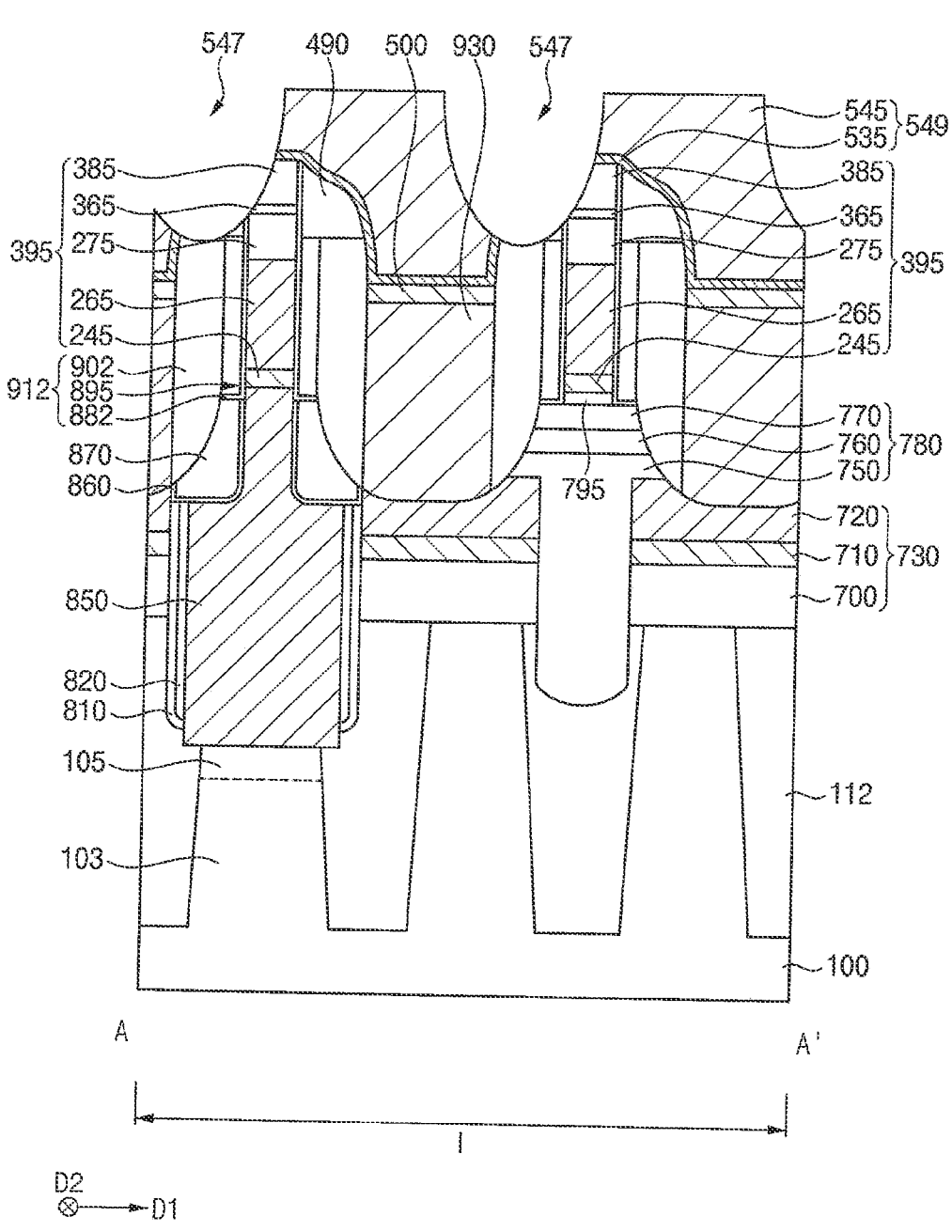
Figure 39:
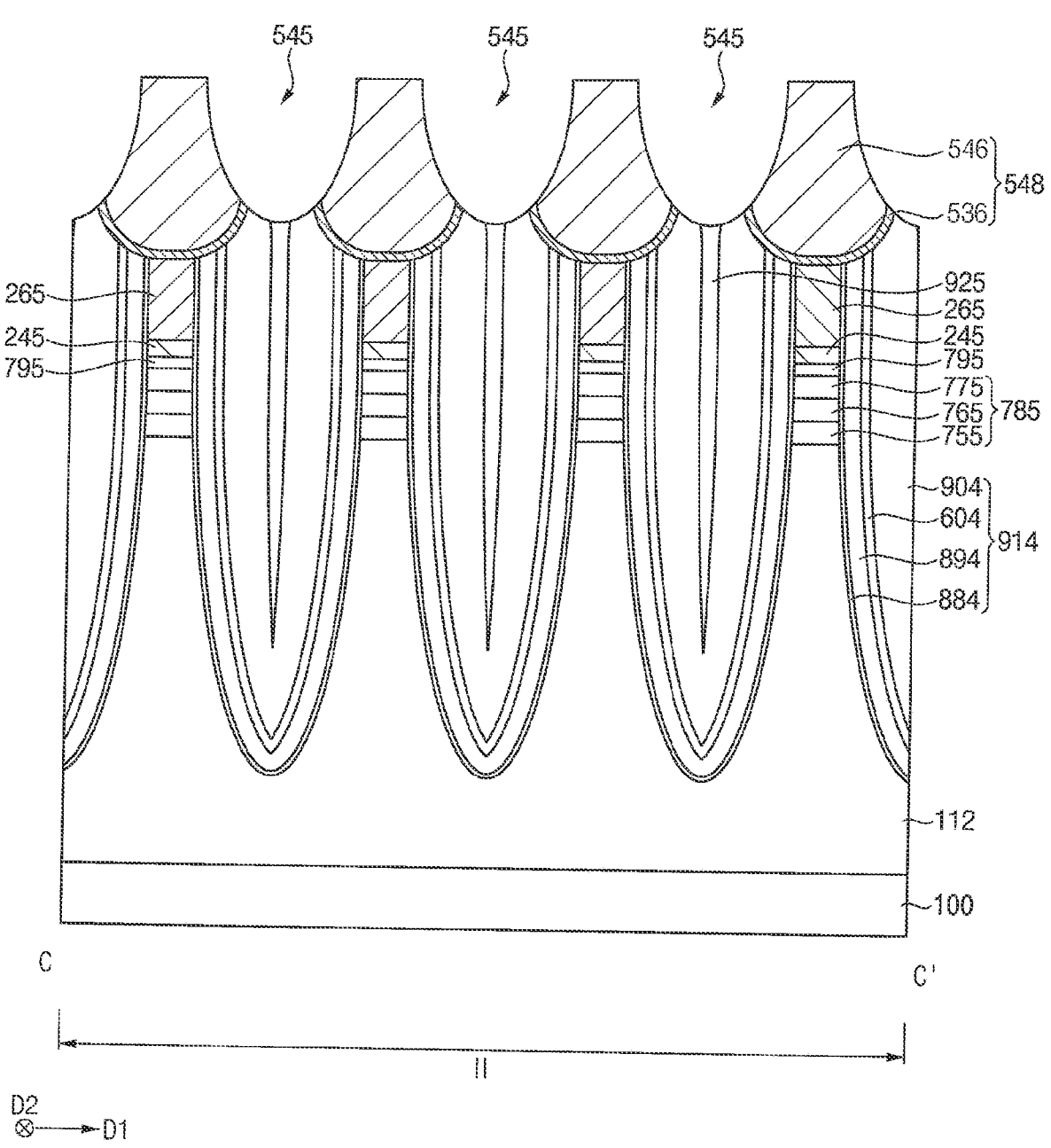

Referring to FIGS. 37 to 39, the second metal layer 540 and the second barrier layer 530 may be patterned to form a second contact plug 549 on the first region I of the substrate 100 and a third contact plug 548 on the second region II of the substrate 100.

A tenth opening 547 may be formed between the second contact plugs 549, and an eleventh opening 545 may be formed between the third contact plugs 548.

During the formation of the tenth opening 547, not only the second metal layer 540 and the second barrier layer 530 but also an upper portion of the insulation structure included in the bit line structure 395, the preliminary spacer structure 912 and the fourth spacer 490 on the sidewall thereof, and the third capping pattern 940 may also be partially removed, and thus an upper surface of the second upper spacer 892 may be exposed.

As the tenth opening 547 is formed, the second metal layer 540 and the second barrier layer 530 may be transformed, respectively, into a second metal pattern 545 and a second barrier pattern 535 that covers a lower surface and a sidewall of the second metal pattern 545, which may form a second contact plug 549. Additionally, as the eleventh opening 545 is formed, the second metal layer 540 and the second barrier layer 530 may be transformed, respectively, into a third metal pattern 546 and a third barrier pattern 536 covering a lower surface and a sidewall of the third metal pattern 546, which may form a third contact plug 548.

In some example embodiments, a plurality of second contact plugs 549 may be spaced apart from each other in the first and second directions D1 and D2 on the first region I of the substrate 100, and may be arranged in a honeycomb pattern or a lattice pattern in a plan view. Each of the second contact plugs 549 may have a shape of a circle, an ellipse, or a polygon in a plan view.

The first contact plug 930, the ohmic contact pattern 500 and the second contact plug 549 sequentially stacked on the first region I of the substrate 100 may form a contact plug structure.

The exposed second upper spacer 892 may be removed to form an air gap 895 connected with the tenth opening 547. The second upper spacer 892 may be removed by, e.g., a wet etching process.

In some example embodiments, not only a portion of the second upper spacer 892 directly exposed by the tenth opening 547 but also a portion of the second upper spacer 892 parallel thereto may be removed. That is, not only the portion of the second upper spacer 892 exposed by the tenth opening 547 not to be covered by the second contact plug 549 but also a portion of the second upper spacer 830 covered by the second contact plug 549 may be removed.

The second insulation spacer 894 on the second region II of the substrate 100 may be partially or entirely removed by the wet etching process. If the insulation spacer 894 is removed, the air gap 895 may be formed, which is shown in FIG. 3B.

Referring to FIGS. 1, 2, 3A and 3B again, second and third insulation patterns 615 and 617 may be formed on inner walls of the tenth and eleventh openings 547 and 545, respectively, and fourth and fifth insulation patterns 620 and 625 may be formed on the second and third insulation patterns 615 and 617 to fill remaining portions of the tenth and eleventh openings 547 and 545, respectively. Thus, a top of the air gap 895 may be closed by the second and third insulation patterns 615 and 617.

The air gap 895 may also be referred as an air spacer 895, and the first upper spacer 882, the air spacer 895 and the third upper spacer 902 may collectively form an upper spacer structure 915.

The second and fourth insulation patterns 615 and 620 may collectively form a first insulation pattern structure, and the third and fifth insulation patterns 617 and 625 may collectively form a second insulation pattern structure.

A fourth etch stop layer 630 may be formed on the first and second insulation pattern structures, the second and third contact plugs 549 and 548, the third capping pattern 480 and the first insulation pattern 925, and a mold layer may be formed on the fourth etch stop layer 630. A portion of the mold layer and a portion of the fourth etch stop layer 630 thereunder may be partially etched to form a twelfth opening exposing an upper surface of the second contact plug 549.

As the plurality of second contact plugs 549 is spaced apart from each other in the first and second directions D1 and D2, and may be arranged in a honeycomb pattern or a lattice pattern in a plan view, the twelfth openings exposing the second contact plugs 549 may also be arranged in a honeycomb pattern or a lattice pattern in a plan view.

A lower electrode layer may be formed on a sidewall of the twelfth opening, the exposed upper surface of the second contact plug 549 and the mold layer, a third sacrificial layer may be formed on the lower electrode layer to fill the twelfth opening, and the lower electrode layer and the third sacrificial layer may be planarized until an upper surface of the mold layer is exposed to divide the lower electrode layer into a plurality of parts.

Thus, a lower electrode 640 having a shape of a cylinder may be formed in the ninth opening. However, if the twelfth opening has a small width, the lower electrode 640 may have a shape of a pillar.

The third sacrificial layer and the mold layer may be removed by, e.g., a wet etching process using, e.g., LAL solution.

A dielectric layer 650 may be formed on a surface of the lower electrode 640 and the fourth etch stop layer 630. The dielectric layer 650 may include, e.g., a metal oxide.

An upper electrode 660 may be formed on the dielectric layer 650. The upper electrode 660 may include, e.g., a metal, a metal nitride, a metal silicide, doped silicon-germanium, etc. In some example embodiments, the upper electrode 660 may have a first upper electrode including a metal or a metal nitride and a second upper electrode including doped silicon-germanium.

The lower electrode 640, the dielectric layer 650 and the upper electrode 660 may form a capacitor 670.

Upper wirings may be further formed on the capacitor 670 to complete the fabrication of the semiconductor device.

As described above, the sacrificial spacer layer 600 may be formed on the first and second upper spacer layers 880 and 890 covering the sidewall and the upper surface of the bit line structure 395, the third mask 610 may be formed on the sacrificial spacer layer 600 to cover the second region II of the substrate 100 on which the end portion of the bit line structure 395 is formed, and the second upper spacer layer 890 and the first upper spacer layer 880 may be etched to form the first and second upper spacers 882 and 892 on the sidewall of the bit line structure 395 on the first region I of the substrate 100, and the sacrificial spacer layer 600 may remain on the second region II of the substrate 100.

After removing the third mask 610, the third upper spacer layer 900 may be formed on the upper surface of the bit line structure 395, the first and second upper spacers 882 and 892, and the sacrificial spacer layer 600, and may be anisotropically etched to form the third upper spacer 902 on the upper surface and the outer sidewall of the second upper spacer 892 on the first region I of the substrate 100 and the fourth insulation spacer 904 on the second region II of the substrate 100.

During the anisotropic etching process on the second region II of the substrate 100 in which the end portion of the bit line structure 395 is formed, when compared to the first region I of the substrate 100 in which a central portion of the bit line structure 395 in the second direction is formed, over-etching may occur such that a portion of the insulation spacer structure 914 covering the sidewall of the bit line structure 395 may be entirely removed to expose the sidewall of the bit line structure 395. In this case, the third conductive pattern 265 included in the bit line structure 395 may be partially removed so that the bit line structure 395 may not function.

However, in some example embodiments, the sacrificial spacer layer 600 may be additionally formed on the first and second upper spacer layers 880 and 890, and when the sacrificial spacer layer 600 is removed on the first region I of the substrate 100, the sacrificial spacer layer 600 on the second region I of the substrate 100 may not be removed, but remain.

Thus, when the third upper spacer layer 900 is formed on the first and second regions I and II of the substrate 100 and the anisotropic etching process is performed, when compared to the first region I of the substrate 100 in which only the third upper spacer layer 900 is formed on the first and second upper spacers 882 and 892, both of the sacrificial spacer layer 600 and the third upper spacer layer 900 may be formed on the first and second upper spacer layers 880 and 890 to have a relatively large thickness on the second region II of the substrate 100, so that the sidewall of the bit line structure 395 may not be exposed by the anisotropic etching process and the third conductive pattern 265 included in the bit line structure 395 may not be removed.

Particularly, even though the sacrificial spacer layer 600 is further formed on the first and second regions I and II of the substrate 100, the third mask 610 covering the second region II of the substrate 100 is formed, and when the anisotropic etching process is performed on the first and second upper spacer layers 880 and 890 on the first region I of the substrate 100, the sacrificial spacer layer may be formed, so that the number of process steps or cost for the process may not increase.

What is claimed is:
1. A semiconductor device comprising:
a substrate including a first region and a second region;
a bit line structure that extends over the first region and the second region of the substrate;

an upper spacer structure on a first sidewall of the bit line structure on the first region of the substrate;

an insulation spacer structure on the first sidewall of the bit line structure on the second region of the substrate; and an isolation pattern on the substrate, the isolation pattern defining an active pattern on the substrate, wherein:

the upper spacer structure includes first, second and third upper spacers that are sequentially stacked on the first sidewall of the bit line structure in a first horizontal direction, the insulation spacer structure includes first, second, third and fourth insulation spacers that are sequentially stacked on the first sidewall of the bit line structure in the first horizontal direction, the first, second and fourth insulation spacers include the same materials as the first, second and third upper spacers, respectively, the bit line structure on the second region of the substrate is on the isolation pattern, and the insulation spacer structure covers an upper sidewall of the isolation pattern.

2. The semiconductor device according to claim 1, wherein the first, second and fourth insulation spacers include silicon nitride, air and silicon nitride, respectively.

3. The semiconductor device according to claim 1, wherein the third insulation spacer includes silicon nitride.

4. The semiconductor device according to claim 3, wherein the third and fourth insulation spacers include the same material as each other, and are merged with each other.

5. The semiconductor device according to claim 1, further comprising:

an insulating pad layer structure under the bit line structure on the first region of the substrate; and an insulation pad structure between the bit line structure and the isolation pattern on the second region of the substrate, the insulation pad structure including the same material as the insulating pad layer structure.

6. The semiconductor device according to claim 5, wherein each of the insulating pad layer structure and the insulation pad structure includes a silicon nitride layer, a silicon oxide layer and a silicon nitride layer sequentially stacked in a vertical direction.

7. The semiconductor device according to claim 1, wherein the bit line structure is a first bit line structure that extends in a second horizontal direction that intersects the first horizontal direction, and wherein the insulation spacer structure contacts sidewalls of the first bit line structure and a second bit line structure that neighbors the first bit line structure in the first horizontal direction.

8. The semiconductor device according to claim 7, wherein an insulation pattern is on the fourth insulation spacer between the first and second bit line structures.

9. The semiconductor device according to claim 1, wherein the bit line structure includes a conductive structure and an insulation structure stacked in a vertical direction, and wherein the semiconductor device further comprises a contact plug that extends through the insulation structure and contacts the conductive structure on the second region of the substrate.

10. The semiconductor device according to claim 1, further comprising:

a conductive filling pattern under the bit line structure; and a lower spacer structure on a sidewall of the conductive filling pattern.

11. A semiconductor device comprising:

a substrate including a cell region and an extension region at a side of the cell region;

an isolation pattern on the substrate;

an active pattern on the substrate defined by the isolation pattern;

a bit line structure having a first portion extending on the cell region of the substrate and a second portion extending on the extension region of the substrate;

an upper spacer structure on a sidewall of first portion of the bit line structure; and an insulation spacer structure on a sidewall of the second portion of the bit line structure on the extension region, wherein:

the first portion of the bit line structure is on the active pattern and the isolation pattern on the cell region of the substrate, and the second portion of the bit line structure is on the isolation pattern on the extension region of the substrate, a thickness of the insulation spacer structure in a first horizontal direction is greater than a thickness of the upper spacer structure in the first horizontal direction, and the insulation spacer structure covers an upper sidewall of the isolation pattern.

12. The semiconductor device according to claim 11, wherein the bit line structure extends in a second horizontal direction, and the bit line structure is one of a plurality of bit line structures spaced apart from each other in the first horizontal direction, and wherein the extension region is provided on each of opposite sides in the second horizontal direction of the cell region.

13. The semiconductor device according to claim 11, wherein the insulation spacer structure covers an upper sidewall of the isolation pattern.

14. The semiconductor device according to claim 11, wherein the bit line structure is a first bit line structure, and wherein the insulation spacer structure contacts sidewalls of the first bit line structure and a second bit line structure that is adjacent to the first bit line structure in the first horizontal direction.

15. The semiconductor device according to claim 11, wherein:

the upper spacer structure includes first, second and third upper spacers sequentially stacked on the sidewall of the bit line structure in the first horizontal direction, the insulation spacer structure includes first, second, third and fourth insulation spacers sequentially stacked on the sidewall of the bit line structure in the first horizontal direction, and the first, second and fourth insulation spacers include the same materials as the first, second and third upper spacers, respectively.

16. The semiconductor device according to claim 15, wherein the third and fourth insulation spacers include the same material as each other, and are merged with each other.

17. A semiconductor device comprising:

a substrate including a first region and a second region;

an isolation pattern on the substrate;

an active pattern on the first region of the substrate, sidewalls of the active pattern being surrounded by the isolation pattern;

a bit line structure on the first and second regions of the substrate;

an upper spacer structure on a sidewall of the bit line structure on the first region of the substrate; and an insulation spacer structure on the sidewall of the bit line structure on the second region of the bit line structure;

wherein:

the upper spacer structure includes first, second and third upper spacers sequentially stacked on the sidewall of the bit line structure in a first horizontal direction, the insulation spacer structure includes first, second, third and fourth insulation spacers sequentially stacked on the sidewall of the bit line structure in the first horizontal direction, the first, second and fourth insulation spacers include the same materials as the first, second and third upper spacers, respectively, the bit line structure on the second region of the substrate is on the isolation pattern, and the insulation spacer structure covers an upper sidewall of the isolation pattern.

18. The semiconductor device according to claim 17, wherein the bit line structure is a first bit line structure that extends in a second horizontal direction, and wherein the insulation spacer structure contacts sidewalls of the first bit line structure and a sidewall of a second bit line structure that extends in the second horizontal direction and neighbors the first bit line structure in the first horizontal direction.

\*   \*   \*   \*   \*